United States Patent [19]

Martin et al.

[11] Patent Number: 5,752,070
[45] Date of Patent: May 12, 1998

[54] ASYNCHRONOUS PROCESSORS

[75] Inventors: A. J. Martin; S. M. Burns, both of Pasadena, Calif.

[73] Assignee: California Institute of Technology, Pasadena, Calif.

[21] Appl. No.: 272,856

[22] Filed: Jul. 8, 1994

Related U.S. Application Data

[63] Continuation of Ser. No. 495,835, Mar. 19, 1990, abandoned.
[51] Int. Cl.$^6$ ............................................. G06F 13/00
[52] U.S. Cl. ............... 395/800.33; 364/230; 364/231.8; 364/240; 364/242.6; 364/DIG. 1
[58] Field of Search ............................ 395/375, 800

[56] References Cited

U.S. PATENT DOCUMENTS

| | | | |
|---|---|---|---|
| 3,290,511 | 12/1966 | Sims | 395/375 |
| 4,680,701 | 7/1987 | Cochran | 395/375 |
| 5,070,451 | 12/1991 | Moore et al. | 395/375 |
| 5,133,077 | 7/1992 | Karne et al. | 395/800 |
| 5,305,462 | 4/1994 | Grondalski | 395/800 |

OTHER PUBLICATIONS

A. Martin et al. "The Design of an Asynchronous Microprocessor" The MIT Press Cambridge, Massachusetts, London England pp. 1–22 Mar. 1989.

"Syntax–directed Translation of Concurrent Programs", Steven Burns and Alain J. Martin. Advanced Research in VLSI. Proceedings of the 5th MIT Conference, MIT Press, pp. 35–50 (1988).

"A Synthesis Method for Self–Timed VLSI Circuits", Alain J. Martin The Institute of Electrical and Electronics Engineers, Inc. 1987 IEEE.

"Compiling Communicating Processess into delay–insensitive VLSI Circuits", Alain J. Martin. Distributing Computing pp. 226–234 (1986).

"The Design of an Asynchronous Microprocessor", Alain J. Martin et al. The MIT Press Cambridge, Massachusetts, London, England pp. 351–373, (1989).

"Communicating Sequential Processes", Comm. ACM 21, 8, pp. 666–667 Aug. 1978. C.A.R. Hoare.

"The First Asynchronous Microprocessor", The Test Results: Alain Martin, et al. Computer Architecture News, vol. 17 No. 4, p. 950110 (1989).

Martin, A.J., "The Limitations to Delay–insensitivity in Asynchronous Circuits," to Appear in Sixth MIT Conference on Advanced Research in VLSI, MIT press, (1990).

The Design of a Self–timed Circuit for Distributed Mutual Exclusion Alain J. Martin. Depart. of Computer Science Calif. Institute of Technology. 1985 Chapel Hill (North Carolina) Conference on VLSI. pp. 245–260.

"Self–Timed Fifo: An Exercise in Compiling Programs into VLSI Circuits", Alain J. Martin. Elsevier Science Publishers B.V. (North–Holland) IFIP, 1987. pp. 133–153.

"Synthesis of Self–Timed Circuits by Program Transformation" Steven M. Burns and Alain J. Martin. The Fusion of Hardware Design and Verification, G.J. Milne, ed., North Holland (1988).

*Primary Examiner*—Kevin J. Teska
*Assistant Examiner*—Ayni Mohamed
*Attorney, Agent, or Firm*—Fish & Richardson P.C.

[57] ABSTRACT

An asynchronous and delay-insensitive data processor comprises a plurality of components communicating with each other and synchronizing their activities by communication actions on channels and buses. Each component consists of a control part and a data part. All control parts are implemented with a lazy-active-passive handshake protocol and a sequencing means called a left/right buffer that provides the minimal sequencing constraints on the signals involved. The data parts comprise novel asynchronous ALU, buses, and registers. The control parts and data parts are connected together in an asynchronous and delay-insensitive manner.

42 Claims, 14 Drawing Sheets

| | | |
|---|---|---|
| ALU | op rx ry rz | rz, f := rx op ry |
| MEM | op rx ry rz | rz := mem[rx+ry] (for load) |
| | | mem[rx+ry] := rz (for store) |
| MEMOFF | op ao ry rz<br>offset | rz := mem[ry + offset] (for load)<br>mem[ry + offset] := rz (for store)<br>rz := ry + offset (for load address) |
| BRANCH | op ao -- cc<br>offset | if cond(f,cc) then pc := pc + offset |
| JUMP | op ao ry -- | pc := ry |
| STPC | op ao -- rz | rz := pc |

TABLE 1: Instruction Types

| inst | $n_3$<br>$b_{15}b_{14}b_{13}b_{12}$ | $n_2$<br>$b_{11}b_{10}b_9b_8$ | $n_1$<br>$b_7b_6b_5b_4$ | $n_0$<br>$b_3b_2b_1b_0$ |
|---|---|---|---|---|
| alu | 0011 | rx | ry | rz |
| | 0100 | rx | ry | rz |
| | ⋮ | | | |
| | 1111 | rx | ry | rz |
| ld | 0010 | rx | ry | rz |
| st | 0001 | rx | ry | rz |
| ldx | 0000 | 0000 | ry | rz |
| stx | 0000 | 0001 | ry | rz |
| lda | 0000 | 0010 | ry | rz |
| brc | 0000 | 0011 | -- | cc |
| jmp | 0000 | 0100 | ry | -- |
| stpc | 0000 | 0101 | -- | rz |

TABLE 2: Opcode Assignments

Figure 1B

IMEM ≡ *[ID!imem[pc]]
FETCH ≡ *[PCI1;ID?i;PCI2;
         [offs(i.op) → PCI1; ID?offset;PCI2
         [] ¬ offs(i.op) → skip
         ];E1!i;E2
        ]
PCADD ≡ (*[[$\overline{PCI1}$ → PCI1; y := pc + 1; PCI2; pc := y
         []$\overline{PCA1}$ → PCA1; y := pc + offset; PCA2;pc := y
         []$\overline{Xpc}$ → X!pc • Xpc
         []$\overline{Ypc}$ → Y?pc • Ypc
         ]]
      ∥ * [[$\overline{Xof}$ → X!offset • Xof]]
      )

EXEC = *[E1?j;
         [alu(j.op) → E2; Xs • Ys • AC!j.op • ZAs
         []ld(j.op) → E2; Xs • Ys • MC1 • ZRs
         []st(j.op) → E2; Xs • Ys • MC2 • ZWs
         []ldx(j.op) → Xof • Ys • MC1 • ZRs; E2
         []stx(j.op) → Xof • Ys • MC2 • ZWs; E2
         []lda(j.op) → Xof • Ys • MC3 • ZRs; E2
         []stpc(j.op) → Xpc • Ys • AC!add • ZAs; E2
         []jmp(j.op) → Ypc • Ys; E2
         [brch(j.op) → F?f; [cond(f,j.cc) → PCA1; PCA2
                            [] ¬ cond(f,j.cc) → skip
                            ]; E2
         ]

Figure 2A $$\text{ALU} \equiv *[[\overline{AC} \rightarrow AC?op \bullet X?x \bullet Y?y;$$
$$\langle z,f \rangle := aluf(x,y,op,f); ZA!z$$
$$[]F \rightarrow F!f$$
$$]]$$
$$\text{MU} = *[[\overline{MC1} \rightarrow X?x \bullet Y?y \bullet MC1; ma := x + y; MD1?w; ZM!w$$
$$[]\overline{MC2} \rightarrow X?x \bullet Y?y \bullet MC2 \quad ZM?w; ma ;= x + y; MDs!w$$
$$[]\overline{MC3} \rightarrow X?x \bullet Y?y \bullet MC3; ma := x + y; ZM!ma$$
$$]]$$
$$\text{DMEM} = *[[\overline{MD1} \rightarrow MD1!dmem[ma]$$
$$[]\overline{MDs} \rightarrow MDs?dmem[ma]$$
$$]]$$
$$\text{REG}[k] = ( * [[\neg bk \wedge k = j.x \wedge Xs \rightarrow X!r \bullet Xs]]$$
$$\| * [[\neg bk \wedge k = j.y \wedge Ys \rightarrow Y!r \bullet Ys]]$$
$$\| * [[\neg bk \wedge k = j.z \wedge ZWs \rightarrow ZM!r \bullet ZWs]]$$
$$\| * [[\neg bk \wedge k = j.z \wedge ZAs \rightarrow bk\uparrow; ZAs; ZA?r; bk\downarrow]]$$
$$\| * [[\neg bk \wedge k = j.z \wedge ZRs \rightarrow bk\uparrow; ZRs; ZM?r; bk\downarrow]]$$
$$)$$

Figure 2B

ASYNCHRONOUS PROCESSORS

This is a continuation of application Ser. No. 07/495,835 filed Mar. 19, 1990 now abandoned.

ORIGIN OF THE INVENTION

The invention was made with the support of the United States Government pursuant to Navy Contract No. N00014-87-K-0745.

RELATED APPLICATIONS

—None—

BACKGROUND OF THE INVENTION

This invention relates to data processors such as calculators, micro-controllers, microprocessors, digital signal processors, central processing units of microcomputers, minicomputers, and large-scale computers generally. This invention relates to U.S. Pat. No. 4,680,701, issued Jul. 14, 1987 to Michael J. Cochran, and U.S. Pat. No. 3,290,511, issued Dec. 6, 1966 to John C. Sims.

Modern data processors are usually built as digital electrical circuits and the several logic elements thereof are designed to operate on a fixed time scale determined by a clock source forming an inherent part of the circuit. For instance, let L1 and L2 be two components of the circuit. L1 can be the component that decodes instructions in a processor, and L2 can be the arithmetic and logical unit (ALU) of the processor. L1 gets an instruction x and produces a decoded instruction y. After that, L2 takes y and produces the result z of the instruction. For L2 to start computing z only after the result y of L1 is valid, a sequencing means must be part of the circuit. Such a means is usually a clock, the operation of which relies on the knowledge of the durations of the operations of L1 and L2. More precisely, if a clock signal triggers L1 at time t to start the computation of y, and if the computation requires less than d units of time in all cases, then another clock signal may trigger L2 at time t+d to start the computation of z. All present data processors we know of use a clock scheme and are therefore said to be "synchronous."

Observe that in order to function correctly, the clock scheme between components L1 and L2 in the example above must use the worst-case delay for d, including some provision for the skewing of the clock signals as they are distributed across the circuit. This serious drawback of synchronous techniques has been known for as long as such techniques have been used and is well explained in U.S. Pat. No. 3,290,511.

The difficulties and inefficiencies inherent to synchronous techniques have been exacerbated by the advent of Very-Large-Scale-Integration (VLSI) semiconductor technology, in which possibly very large electrical circuits can be integrated on one piece of semiconductor material, for instance silicon. (Such an integrated circuit is usually called a "chip.") Improvement in performance of VLSI circuits is achieved mainly through decrease in the physical dimensions of the basic features of the circuit. But continued miniaturization of integrated circuits has adversary side-effects with respect to the use of clocks.

First, the decrease in size of all physical parameters of a circuit (usually called "scaling" in the literature) has for a result that the transmission delays in the wires connecting logical elements increase relatively to the switching delays of the elements themselves. (This phenomenon is well explained in the literature. See, for instance, Reference 9.) As a consequence, the transmission of a clock signal from one point of a circuit to several other ones becomes more and more difficult if the signals are to arrive at about the same time at the different points. This phenomenon is called "clock skew" and is a major problem in the design of clocked electronic circuits. In particular, the designer may have to increase the clock period to accommodate the clock skew. Another consequence of increased wire delays is that the layout of the circuits (i.e. the physical placement of the elements on the surface and the wiring of the elements) has to be done very carefully since the proper functioning of the circuit may critically depend on the lengths of the wires.

A second adversary side-effect of miniaturization is that controlling the physical parameters of the fabrication process becomes more and more difficult. Less control on the fabrication process results in an increased variation in the physical parameters of the chip, such as noise margin, switching-thresholds, resistance and capacitance of nodes, etc. An accurate evaluation of these parameters is essential to a precise estimate of the worst-case duration of a computation step. Therefore, a lack of accuracy in the evaluation of these parameters results in increased clock period and less tolerance to the variations of the operating parameters, in particular, voltage level and temperature.

Because a precise adjustment of the clock period implies a comparison and calibration of all elements of a chip, modification of a circuit usually requires a complete redesign of the whole circuit. Hence, it is notoriously difficult for a manufacturer to develop a line of products in which each is an incremental improvement of the preceding one.

BACKGROUND—DISCUSSION OF PRIOR ART

Heretofore, in spite of inherent advantages of asynchronous techniques, such techniques have failed to gain ground in the semiconductor and computer industry because of several reasons.

A basic idea in asynchronous design is that if a clock signal cannot be used to indicate when an operation of a component—for instance component L1 of the previous example—is finished and the next operation of another component—L2 in the previous example—may start, then some kind of completion signal must be produced by L1 and observed by L2. The occurrence of such a completion signal must be synchronized with the production of a valid value for output y of L1.

A means of producing a completion signal is by constructing each element so that the data produced is encoded with an additional value corresponding to the invalid state of the data. Hence the completion of the operation of an element can be detected when the data has any value different from the invalid value. A change of value always implies the transition from invalid to valid or from valid to invalid. Such technique is well explained in U.S. Pat. No. 3,290,511, for the special encoding where each bit is encoded with two wires. We call such encoding "dual-rail." It is also described in Reference 11.

In a data processor, operations on a datum are usually decomposed into a plurality of concurrent elementary operations on different portions of the datum. (For instance, an addition on two integers coded as a string of n bits is usually implemented as n additions on the pairs of bits in the corresponding positions of the two integers.) If such a decomposition is performed, an elementary completion signal is produced for each elementary operation, and all elementary completion signals are combined into one global completion signal. The piece of circuitry that collects all completion signals into one is called a "completion tree." If not implemented properly, completion trees may introduced extra delays in the operation of the processor. Such delays may easily offset the advantages of variable duration of operations.

An alternative method for generating completion signals consists of introducing delay elements that have been calibrated to have an internal delay longer than that of the operation the termination of which has to be signaled. Hence, when the completion signal arrives at its destination, the data produced by the element have a valid value.

But, this method reintroduces some of the disadvantages of synchronous techniques since it requires a knowledge of the internal delays and a means of controlling them, which as we have already mentioned, is difficult to achieve in VLSI.

Glitches and Hazards

When the inputs of a logic element are assigned new values, the element may produce spurious values on some of the corresponding outputs before stabilizing to the final valid values of the outputs. Such intermediate spurious values are usually called "glitches" or "hazards" and are usually caused by a race-condition on some input signals to a corresponding gate of circuit.

In a synchronous circuit, the clock period of the circuit can be adjusted so that when the output data, is made available to the next element, all glitches have disappeared from the wires. But, this technique is obviously not available in asynchronous design. Hence, in the design of an asynchronous circuit, care must be taken that either the glitches are not generated or they are eliminated immediately after they occur and thus before they can be observed by the next element.

Heretofore, all prior art relies on the introduction of delay elements to deal with glitches in asynchronous circuits: Either, delays are added to some inputs of some gates to enforce time ordering on the change of values of the inputs, thus eliminating the race conditions that could result in a glitch. Or, inertial delays are added on the outputs of some gates to absorb the glitches before they propagate to the next element.

For instance, prior art U.S. Pat. No. 4,680,701, admits that races and hazards can occur in their design when they say that their design method "virtually eliminates the logic race and logic hazard concerns traditionally associated with asynchronous logic." They try to reduce the risk of hazards by having "most of each instruction executed serially by block." But, such a technique cannot produce circuits with speed comparable with that of equivalent synchronous ones, since most of the speed gain in modern processor design is achieved through concurrency, in particular pipelining.

Efficient Circuit Techniques

Devices for data processing have reached such a complexity that their construction requires very well defined and general procedures. Such design procedures are available for synchronous design in the form of logic optimization procedures, state assignment algorithms, standard techniques for the implementation and minimization of finite-state machines and other procedures that are described in all standard texts on logic design.

Heretofore, no general design methods exist, in particular in VLSI technology, for the design of asynchronous circuits down to the detailed level of, for instance, the transistor in the case of semiconductor technology. The most complete design methods proposed so far address the design of FIFO queues, admittedly a rather restricted class of circuits. Even for FIFOs, the solutions proposed are not the most efficient ones.

The prior art fails to recognize that the need for special circuitry to implement sequencing without a clock, and the convention that all data go through a valid/invalid cycle of values, require building blocks (gates) that are drastically different from those used in synchronous design, in which the gates are used only to implement combinational functions and registers (latches). Heretofore, the only special gate introduced for asynchronous circuits is the so-called "Muller-C element" also called "C-element," (see Reference 10). But, the C-element is only one particular case of a general class of gates that are all necessary for implementing asynchronous circuits efficiently.

OBJECTS AND ADVANTAGES

Accordingly, we claim the following as our objects and advantages of the invention.

It is an object of the invention to provide a data processor that is a quasi delay-insensitive (DI) circuit and yet fast, robust to variations of voltage and temperature, and that consumes much less power than conventional processors. An asynchronous circuit is DI when its correct operation is independent of any assumption on delays in operators and wires except that the delays are finite. Such circuits do not use a clock signal since they are asynchronous, but, moreover, they don't use knowledge about delays.

We have proved that the class of entirely DI circuits is very limited (see Reference 8). Different asynchronous techniques distinguish themselves in the choice of the compromises to delay-insensitivity. Speed-independent techniques assume that delays in gates are arbitrary, but there are no delays in wires. Self-timed techniques assume that a circuit can be decomposed into equipotential regions inside which wire delays are negligible (see Reference 11). In our method, certain local 'forks' are introduced to distribute a variable as inputs of several operators. We assume that the differences in delays between the branches of the fork are shorter than the delays in the operators to which the fork is an input. We call such forks isochronic (see References 4 and 8). In the sequel, the term 'delay-insensitive' means 'delay-insensitive with the exception of isochronic forks.'

We have already provided a general method for designing DI circuits (see literature). The circuits obtained by this method are guaranteed by construction to be a correct implementation of the specification and to be free of critical races and hazards.

In this method, a circuit is first described as a concurrent computation in a notation inspired by programming language notations for concurrent (also called parallel) algorithms. The description of the circuit in this high-level notation is then taken as the specification of the design that each further design refinement has to meet. In this notation, a digital circuit is described as a collection of concurrent automata, called "processes," that communicate with each other and synchronize their activities primarily but not exclusively by exchanging messages.

It is further an object of the invention to provide improvements and additions to the general method that are necessary to reach speeds competitive with the state of the art, to achieve the robustness requirements that we have already mentioned, and to decrease the power consumption. The improvements and additions are:

(a) A plurality of handshaking protocols for the implementation of communications that minimize the overhead of completion tree delays.

(b) Means for implementing control and data parts separately and then combining them by a standard procedure, in particular means for sharing common communication channels (usually called "buses").

(c) Flexible set of gates tailored to DI techniques (generalized C-elements) that minimize the number of value transitions necessary to implement a given function.

(d) A plurality of architectural techniques for asynchronous processors: asynchronous ALU, register locking mechanism, stalling of pipeline, overlap of instruction fetch and PC update, in general the program of FIGS. 2a and 2b.

The advantages of the invention can be summarized as follows:

The clock rate of a synchronous design has to be slowed to account for the worst-case clock skews in the circuit, and for the slowest step in a sequence of actions. Since delay-insensitive circuits do not use clocks, they can be faster than their synchronous equivalent.

Since the logical correctness of the circuits is independent of the values of the physical parameters, delay-insensitive circuits are very robust to variations of these parameters caused by scaling or fabrication, or by some non-deterministic behavior such as the metastability of arbiters. For instance, the processors we have fabricated in CMOS technology have been found to be functional in a range of voltage values (for the constant voltage level encoding the high logical value) from above 10V to below 1V. They operate at room temperature as well as liquid nitrogen temperature, and the temperature can vary continually during operation. (See result in Reference 7.)

Delay-insensitive circuit design can be modular: A part of a circuit can be replaced by a logically equivalent one and safely incorporated into the design without changes of interfaces.

Because an operator of a delay-insensitive circuit is "fired" only when its firing contributes to the next step of the computation, the power consumption of such circuit can be much lower than that of its synchronous equivalent. For instance, the processors we have fabricated in CMOS consume less than 7 mW at 2V.

Since the correctness of the circuits is independent of propagation delays in wires and, thus, of the length of the wires, the layout of chips is facilitated.

Further objects and advantages of the invention will become apparent from a consideration of the drawings and ensuing description of it.

DESCRIPTION OF DRAWINGS

FIG. 1b shows the instruction set used in said embodiment of said asynchronous processor.

FIGS. 2a and 2b show a notational description of said asynchronous processor.

LIST OF REFERENCES

Figure 1A:
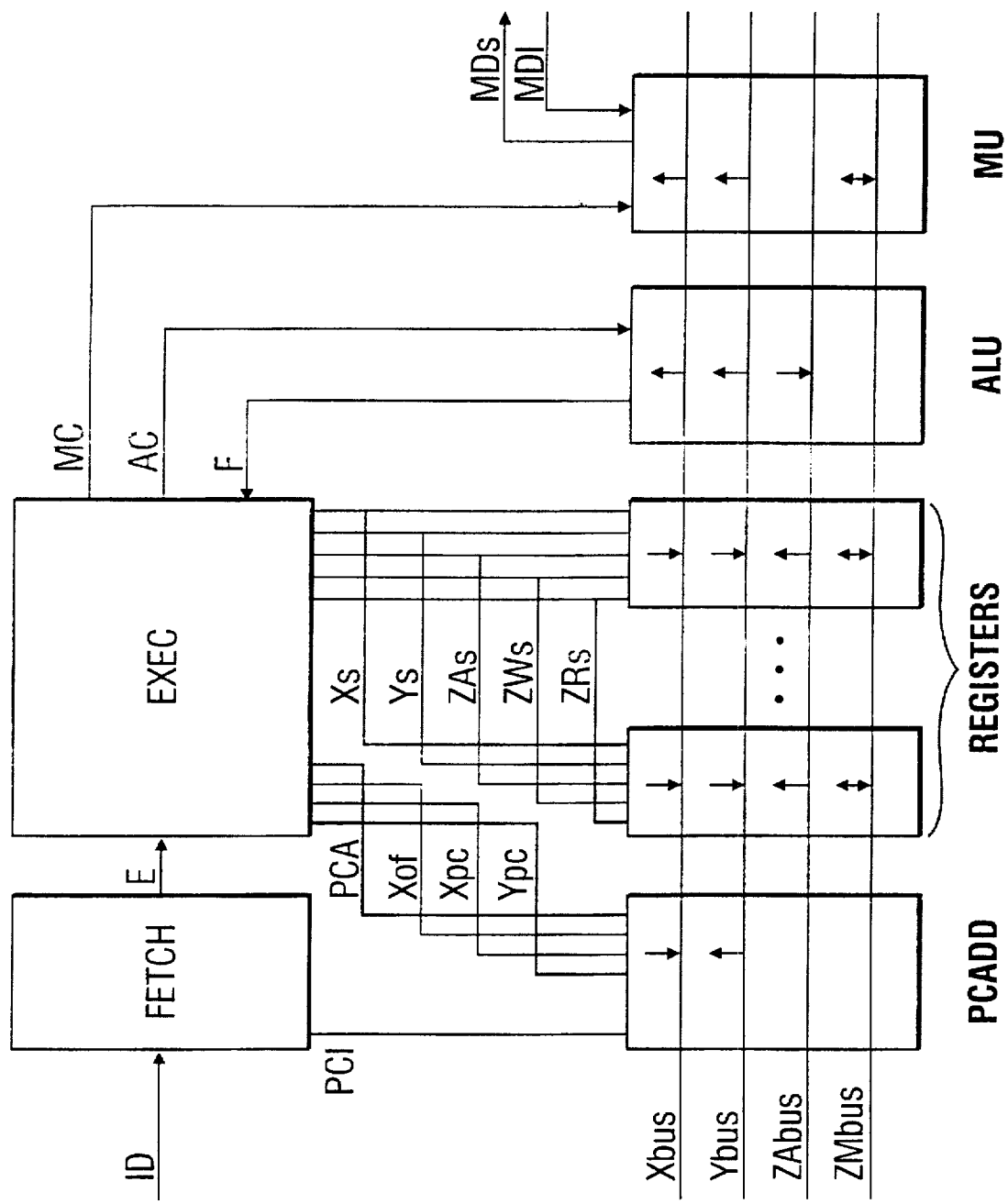
FIG. 1a shows a block diagram description of the preferred embodiment of the asynchronous processor. The diagram illustrates the program description of FIG. 2. Each rectangle represents a functional unit (called a "process"), and the lines between the rectangles represent communication or synchronization channels. The horizontal lines are channels shared by more than two units. Such channels are usually called "buses."

[1] Steven M. Burns and Alain J. Martin, Syntax-directed Translation of Concurrent Programs into Self-timed Circuits. In J. Allen and F. Leighton (ed), *Fifth MIT Conference on Advanced Research in VLSI*, pp 35–40, MIT Press, 1988.

[2] C. A. R. Hoare, Communicating Sequential Processes. *Comm. ACM* 21.8, pp 666–677, August, 1978.

[3] Alain J. Martin, The Design of a Self-timed Circuit for Distributed Mutual Exclusion. In Henry Fuchs (ed), 1985 *Chapel Hill Conf. VLSI*, Computer Science Press, pp 247–260, 1985.

[4] Alain J. Martin, Compiling Communicating Processes into Delay-insensitive VLSI Circuits. *Distributed Computing*, 1,(4), Springer-Verlag, pp 226–234 1986.

[5] Alain J. Martin, A Synthesis Method for Self-timed VLSI Circuits. *ICCD 87: 1987 IEEE International Conference on Computer Design*, IEEE Computer Society Press, pp 224–229, 1987.

[6] Martin, A. J., S. M. Burns, T. K. Lee, D. Borkovic, P. J. Hazewindus, "The Design of an Asynchronous Microprocessor", in *Decennial Caltech Conference on VLSI*, ed. C. L. Seitz, MIT Press, pp 351–373, (1989)

[7] Martin, A. J., S. M. Burns, T. K. Lee, D. Borkovic, P. J. Hazewindus, "The First Asynchronous Microprocessor: The Test Results," in *Computer Architecture News*, Vol. 17, No. 4, 95–110, (1989)

[8] Martin, A. J., "The Limitations to Delay-insensitivity in Asynchronous Circuits,"to Appear in *Sixth MIT Conference on Advanced Research in VLSI*, MIT press, (1990)

[9] Mead, C. and L. Conway, *Introduction to VLSI Systems*, Addison-Wesley, Reading Mass. 1980.

[10] Miller, R. E., *Switching Theory*, Vol. 2, Wiley, (1965)

[11] Charles L. Seitz, System Timing, Chapter 7 in Mead & Conway, *Introduction to VLSI Systems*, Addison-Wesley, Reading Mass., 1980.

DESCRIPTION OF PREFERRED EMBODIMENT

We find it more convenient to describe the invention from a preferred embodiment thereof. The particular processor we use has been effectively realized in CMOS semiconductor technology, fabricated and tested. It therefore provides the proof of realizability of the invention by someone skilled in the art. This embodiment is partially described in the proceedings of the Caltech VLSI Conference, 20–22 March 1989.

Brief Description of the Embodiment

The architecture is a 16-bit processor with offset and a simple instruction set of the RISC (Reduced Instruction Set Computer) type. The data path contains twelve 16-bit registers, four buses, an ALU, and two adders. (The fabricated chip contains 20,000 transistors and fits within a 5500λ by 3500λ area. We are using an 84-pin 6600 μm×4600 μm frame. A slightly improved 1.6 μm SCMOS version has also been fabricated.)

The instruction set of this embodiment is deliberately not innovative. It is a conventional 16-bit-word instruction set of the load-store type. The processor uses two separate memories for instructions and data. There are three types of instructions: ALU, memory, and program-counter (pc). All ALU instructions operate on registers; memory instructions involve a register and a data memory word. Certain instructions use the following word as offset. (See Tables in FIG. 1b.)

Other functions, such as interrupt mechanism, caches, and communication ports, have been omitted from this embodiment but can readily be added by someone skilled in the art. An instruction set with another word length and with or without offset could just as easily be used with this invention.

The Program Describing the Processor

We shall describe the preferred embodiment of the processor in a notation inspired by programming notations. We have found such a notation to be both more concise and more precise than alternative notations based on pictures.

The notation is inspired by C. A. R. Hoare's CSP notation for describing concurrent computation (see Reference 2). In this notation, the processor is a set of concurrent components called "processes."

A process is a cyclic program (i.e., a non-terminating repetition of actions); usually, the program is sequential, but it may also be a concurrent composition of programs or "subprocesses." (An example is the process PCADD of FIG. 2a, which is the concurrent composition of two programs.) A process operates on its own set of local variables. Processes communicate with each other and synchronize their activities by exchanging messages by means of synchronized communication actions on channels.

Restricting the interactions between concurrent activities to well-control communications contribute to eliminating glitches and hazards. However, we have allowed a restricted form of "shared" variables (i.e., variables used by several processes) in a few cases where it is clear that when a process reads the shared variable, no other process is modifying the same variable at the same time. (We could easily eliminate these shared variables and replace them with explicit communications.)

The notation used to described the programs is explained next. The different concurrent components and their communication channels are described in FIG. 1 The processor is described by the program of FIGS. 2a and 2b.

Notation

Variables are either "boolean" or "integer". A boolean variables takes on one of two possible values, called true and false. An integer variable is actually an array of boolean variables—a word of bits. The assignment x :=y stores the current value of x in y. The assignment x :=y+1 consists of first evaluating the expression y+1 and hen storing the value of the expression in x.

If the variables in an assignment are integers, then the assignment notation is a short-hand notation for a set of concurrent assignments on all the matching bits of the integer variables and expression involved in the assignment. p1 b↑ stands for b:=true, b↓ stands for b:=false.

The semicolon is used for the sequencing (ordering in time) of two actions: For two arbitrary actions A and B, 'A; B' means "first execute A, and then execute B".

For communication actions X and Y. "X•Y"stands for the coincident execution of X and Y, i.e., the completions of the two actions coincide.

A selection command is of the form $[G_1 \rightarrow S_1 | \ldots | G_n \rightarrow S_n]$, where $G_1$ through $G_n$ are boolean expressions, i.e. logical formulas the values of which are either true or false, and $S_1$ through $S_n$ are program parts describing any component. ($G_i$ is called a "guard", and $G_i \rightarrow S_i$ a "guarded command")

The execution of such a selection command can be described as follows. At any moment during the activity of the processor, either no guard of the selection command is true or exactly one guard is true. If one guard is true, the execution of the selection command is the execution of the $S_i$ for which $G_i$ is true. If no guard evaluates to true, then the execution of the command is suspended until one of the guards is true.

A repetition command is of the form $*[G_1 \rightarrow S_1 | \ldots | G_n \rightarrow S_n]$, where $G_1$ through $G_n$ are boolean expressions, and $S_1$ through $S_n$ are program parts describing any component.

The execution of such a repetition command can be described as follows. At any moment during the activity of the processor, either no guard of the repetition command is true or exactly one guard is true. If one guard is true, then, first, the $S_i$ the guard of which is true is executed, and, second, the execution of the repetition command is repeated. If no guard evaluates to true, then the execution of the command terminates.

The notation [G], where G is a boolean expression, is a short-hand notation for [G→skip], and thus stands for "wait until G holds".

(Hence, "[G]; S" and [G→S] are equivalent.)

*[S] stands for *[true→S], and thus for "repeat S forever".

From the foregoing, the operational description of the statement $*[[G_1 \rightarrow S_1 | \ldots | G_n \rightarrow S_n]]$ is "repeat forever: wait until some $G_i$ holds; execute an $S_i$ for which $G_i$ holds".

Communication commands: Let two processes, p1 and p2, share a channel X. Each process uses its "port" to the channel in some communication command in its program. When no ambiguity can occur, we use the same name for the ports and for the channel. This is the case in the processor. Hence, the name X in p1 and p2 refers to the two ports to channel X.

If the channel is used only for synchronization between the processes, the name of the port is sufficient to identify a communication command on this port. If the communication is used for input and output of messages, the CSP notation is used: X!u outputs (sends) message u on port X, and X?v inputs a message from port X and store the message in variable v. The combined execution of these two actions results in assigning the value of u to variable v.

At any time, the number of completed X-actions in p1 equals the number of completed X-actions in p2. In other words, the completion of the nth X-action in p1 "coincides" with the completion of the n-th X-action in p2. If, for example, p1 reaches the nth X-action before p2 reaches the nth X-action, the completion of X in p1 is suspended until p2 reaches X. The X-action is then said to be pending.

When, thereafter, p2 reaches the corresponding X, both X actions are completed.

Probe: The probe notation describes a means for a process to detect that there is a pending communication on a port. In a process, the probe command $\overline{X}$ has the same value as the predicate "there is an X action pending in the other process sharing channel X."

Concurrent composition

The concurrent composition of two programs or processes A and B is denoted (A||B). All the processes of the program of FIG. 2 are initialized and started as a result of a global reset command that has been omitted from the description.

Description of the program

Variables

We describe the main variables used in the program of FIG. 1. Variable i in process FETCH, and variable j in process EXEC contain data corresponding to an instruction. Variable i contains the most recently fetched instruction; variable j contains the instruction currently being decoded.

A data (word) corresponding to an instruction consists of several fields (groups of contiguous bits in the word). All instructions contain an op field for the opcode, i.e., the part of the instruction describing the type (addition, subtraction, etc.) of the instruction. The parameter fields depend on the types of the instructions, which are found in Table 1 of FIG. 1b. The most common instructions, those for ALU, load, and store instructions, contain three parameter fields that we have named x, y, and z. The field cc contains the condition code of the branch instruction.

Variable offset contains the word following instruction i in the instruction memory. The content of offset is data pertaining to the previous instruction. (See Table 1 of FIG. 1b for the list of instructions that use an offset.) Variable f contains the flags generated by the execution of an alu instruction. Variable pc, the program-counter variable, contains the address of the next instruction to be fetched from the instruction memory.

Variable ma in process MU contains the address of the location in the data memory that is accessed (written or read) by the memory instruction.

The data parts of the two memories (instruction memory and data memory) are described as the arrays imem and dmem. The index to imem is the program-counter variable, pc. The general-purpose registers are described as the array reg[0 . . . 15], since we use 16 registers in this embodiment. Register reg[0] is special: It always contains the value zero.

Functions

Function offs determines whether the previously fetched instruction uses an offset. Function cond determines whether the currently decoded branch instruction should result in a jump (if cond evaluates to true). Function aluf computes the arithmetic-or-logical operation corresponding to the opcode and the parameters of the decoded instruction.

Components

The components (processes) and their interconnections (channels and buses) are briefly described as follows. The control channels Xs, Ys, ZAs, ZWs, ZRs, and the bus ZA are one-to-many; the buses X, Y, ZM are many-to-many; the other channels are one-to-one. But all channels are used by only two processes at a time.

Process FETCH fetches the instructions from the instruction memory, and transmits them to process EXEC which decodes them. Process PCADD updates the address pc of the next instruction concurrently with the instruction fetch, and controls the offset register. The execution of an ALU instruction by process ALU can overlap with the execution of a memory instruction by process MU. The jump and branch instructions are executed by EXEC; store-pc is executed by the ALU as the instruction "add the content of register r to the pc and store it." The array REG[k] of processes implements the register file. In this embodiment, both MU and PCADD contain their own adder, but they could share the same adder or use the ALU adder.

Processes IMEM and DMEM describe the instruction memory and data memory, respectively.

OPERATION OF THE INVENTION (Working Example)

Updating the PC

Referring now to FIG. 2a, the variable pc is updated by process PCADD, and is used by, IMEM as the index of the array imem during the ID communication—the instruction fetch.

The assignment pc:=pc+1 is decomposed into y:=pc+1;pc:=y, where y is a local variable of PCADD. The overlap of the instruction fetch, ID? (either ID?i or ID?offset), and the pc increment, y:=pc+1, can now occur while pc is constant. Action ID? is enclosed between the two communication actions PCI1 and PCI2, as follows:

PCI1;ID?i;PCI2.

In PCADD, y:=pc+1 is enclosed between the same two communication actions while the updating of pc follows PCI2:

PCI1→PCI1;y:=pc+1;PCI2;pc:=y.

Since the completions of PCI1 and PCI2 in FETCH coincide with the completion of PCI1 and PCI2 in PCADD, respectively, the execution of ID?i in FETCH overlaps the execution of y:=pc+1 in PCADD. PCI1 and PCI2 are implemented as the two halves of the same communication handshaking to minimize the overhead.

In order to concentrate all increments of pc inside PCADD, we use the same technique to delegate the assignment pc:=pc+offset (executed by the EXEC part in the sequential program) to PCADD.

The guarded command $\overline{Xof}$→Xof!offset in PCADD has been transformed into a concurrent process since it needs only be mutually exclusive with assignment y:=x+offset, and this mutual exclusion is enforced by the sequencing between PCA1; PCA2 and Xof within EXEC.

Stalling the Pipeline

When the program counter has to be modified by EXEC as part of the execution of a pc instruction, (store-pc, jump or branch), fetching the next instruction by FETCH is postponed until the correct value of the program counter is assigned to variable pc.

When the offset is reserved for, MU by EXEC, as part of the execution of some memory instructions, fetching the next instruction, which might be a new offset, is postponed until MU has received the value of the current offset. In an alternative embodiment, FETCH is blocked only when the next instruction is a new offset.

Postponing the start of the next cycle in FETCH is achieved by postponing the completion of the previous cycle, i.e., by postponing the completion of the communication action on channel E. As in the case of the PCI communication, E is decomposed into two communications, E1 and E2. Again, E1 and E2 are implemented as the two halves of the same handshaking protocol.

In FETCH, E!i is replaced with E1!i;E2. In EXEC, E2 is postponed until after either Xof?offset or a complete execution of a instruction modifying the program counter has occurred.

Sharing Registers and Buses

A bus is used by two processes at a time, one of which is a register and the other is EXEC, MU, ALU, or PCADD. We therefore decided to introduce enough buses so as not to restrict the concurrent access to different registers. For instance, ALU writing a result into a register should not prevent MU from using another register at the same time.

The four buses correspond to the four main concurrent activities involving the registers, but fewer buses can be used.

The X bus and the Y bus are used to send the parameters of an ALU operation to the ALU, and to send the parameters of address calculation to the memory unit. We also make opportunistic use of them to transmit the pc and the offset to and from PCADD.

The ZA bus is used to transmit the result of an ALU operation to the registers.

The ZM bus is used by the memory unit to transmit data between the data memory and the registers.

We make a virtue out of necessity by turning the restriction that registers can be accessed only through those four buses into a convenient abstraction mechanism. The ALU uses only the X, Y, and ZA ports without having to reference the particular registers that are used in the communications. It is the task of EXEC to reserve the X, Y, and ZA bus for the proper registers before the ALU uses them.

The same holds for the MU process, which references only ports X, Y, and ZM. An additional abstraction is that the X bus is used to send the offset to MU, so that the cases for which the first parameter is j.x or offset are now identical, since both parameters are sent via the X bus.

Exclusive Use of a Bus

Commands Xpc, Ypc, and Xof are used by EXEC to select the X and Y buses for communication of pc and offset. Commands Xs, Ys, and ZAs are used by EXEC to select the X, Y, and ZA buses, respectively, for a register that has to communicate with the ALU as part of the execution of an ALU instruction.

Two commands are needed to select the ZM bus: ZWs if the bus is to be used for writing to the data memory, and ZRs if the bus is to be used for reading from the data memory.

Let us first explain the problem of the mutual exclusion among the different uses of a bus. As long as we have only one ALU and one memory unit, no conflict is possible on the ZA and ZM buses, since only the ALU uses the ZA bus, and only the memory unit uses the ZM bus. But the X and Y buses are used concurrently by the ALU, the memory unit, and the pc unit.

We achieve mutual exclusion on different uses of the X bus as follows. (The same argument holds for Y.) The completion of an X communication is made to coincide with the completion of one of the selection actions Xs, Xof, Xpc; and the occurrences of these selection actions exclude each other in time inside EXEC since they appear in different guarded commands.

This coincidence is implemented by the bullet (•) command: For arbitrary communication commands U and V inside the same process, U•V guarantees that the two actions are completed at the same time. We then say that the two actions coincide. The use of the bullets X!pc•Xpc and X!offset•Xof inside PCADD, and X!r•Xs inside the registers enforce the coincidence of X with Xpc, Xof, and Xs, respectively. The bullets in EXEC, ALU, and MU have been introduced for reasons of efficiency: Sequencing is avoided.

Register Selection

Command Xs in EXEC selects the X bus for the particular register whose index k is equal to the field i.x of the instruction i being decoded by EXEC, and analogously for commands Ys, ZAs, ZRs, and ZWs.

Each register process REG[K] consists of five elementary processes, one for each selection command. The register that is selected by command Xs is the one that passes the test k=j.x. This implementation requires that the field j.x be shared by all registers and EXEC. An alternative solution that does not require shared variables uses demultiplexer processes. (The implementations of the two solutions are almost identical.)

The semicolons in the last two guarded commands of REG[k] are introduced to pipeline the computation of the result of an ALU instruction or memory instruction with the decoding of the next instruction.

Mutual Exclusion on Registers

A register may be used in several arguments (x, y, or z) of the same instruction, and also as an argument in two successive instructions whose executions may overlap. We therefore have to address the issue of the concurrent uses of the same register. Two concurrent actions on the same register are allowed when they are both read actions.

Concurrency within an instruction is not a problem: X and Y communications on the same register may overlap, since they are both read actions, and Z cannot overlap with either X or Y because of the sequencing inside ALU and MU.

Concurrency in the access to a register during two consecutive overlapping instructions (one instruction is an ALU and the other is a memory instruction) can be a problem: Writing a result into a register (a ZA or a ZR action) in the first instruction can overlap with another action on the same register in the second instruction. But, because the selection of the z register for the first instruction takes place before the selection of the registers for the second instruction, we can use this ordering to impose the same ordering on the different accesses to the same register when a ZA or ZR is involved.

This ordering is implemented as follows: In REG [k], variable bk (initially false) is set to true before the register is selected for ZA or ZR, and it is set back to false only after the register has been actually used. All uses of the register are guarded with the condition ¬bk. Hence, all subsequent selections of the register are postponed until the current ZA or ZR is completed.

We must ensure that bk is not set to true before the register is selected for an X or a Y action inside the same instruction, since this would lead to a deadlock. This refinement which is straightforward to someone skilled in the art, does not appear in the program of FIG. 2b.

Restatement of the Description of FIGS. 2a and 2b:

Referring to FIG. 2a, the process IMEM is defined as follows:

$$IMEM = *[ID!imem[pc]].$$

This means that an instruction memory called IMEM (not shown in FIG. 1a) repeats forever the following process: it transmits on the communication line labelled ID in FIG. 1a the contents of an array called imem at the memory location pc, which happens to be the current value of the program counter.

The process FETCH of FIG. 1a is defined in FIG. 2a as follows:

FETCH ≡ *[PCI1;ID?i;PCI2;

[offs(i.op) → PCI1;ID? offset;PCI2

|¬offs(i.op) → skip

];E1!i; E2

].

Specifically, this means that the FETCH process repeats forever a number of operations. First, it extends a handshake or "communication action" on the communication line labelled PCI in FIG. 1a between the FETCH process and the PCADD process, this first communication action being labelled PCI1 in FIG. 2a. Upon the PCADD process acknowledging or completing the PCI1 communication action, the FETCH process next completes the communication action ID on the communication line ID of FIG. 1a with the IMEM process by receiving the instruction transmitted by the IMEM process on the ID communication line. This instruction is called i. The next step is to perform a second communication action on the PCI line, named PCI2, with the PCADD process.

Digressing for a moment from the FETCH process and turning to the PCADD process, the PCADD process repeats forever a number of operations. The first of these operations is stated in FIG. 2a as follows:

*[[$\overline{PCI1}$→PCI1;y:=pc+1;PCI2;pc:=y.

In this operation the PCADD process senses whether the PCI1 communication action has been extended by the FETCH process on the PCI communication line of FIG. 1a. If so, the PCADD process completes the communication action or handshake PCI1 with the FETCH process. Both the FETCH process and the PCADD process are then permitted to perform their next operations, which in the case of the FETCH process was to receive the instruction i on the ID communication line. In the case of the PCADD process, the next operation is to increment the value of the program counter to pc+1 and store it in a register y. The next step is to complete the communication action PCI2 with the FETCH process. Next, the PCADD process replaces the previous value of the program counter pc with the contents of the y register, thus incrementing the stored value of the program counter pc.

Returning to the FETCH process, the next step after the completion of the communication PCI2 with the PCADD process is to determine whether the instruction i last received from the IMEM process on the ID communication line is of the type requiring an offset, in accordance with the definitions of the tables of FIG. 1b. This is the step designated by the notation: offs(i.op). If so, the communication action PCI1 is repeated again. The next step is to receive, on the ID communication line, the instruction stored at the now updated value of pc in the IMEM array and store it in a local register called offset. This operation by the FETCH process is designated in the third line of FIG. 2a as: ID?offset;. The next step by the FETCH process is to complete the communication action PCI2 with the PCADD process. Of course, this repetition of the PCI1 and PCI2 communication actions by the FETCH process results in a second incrementing of the program counter value pc by the PCADD process, in the same manner as described above. The purpose of the skip step in the fourth line of FIG. 2a is to prevent the FETCH process from waiting forever until it finds an instruction word requiring an offset. The final operation performed by the FETCH process is to initiate a communication action on the E communication line with the EXEC process of FIG. 1a, in a first communication action labelled E1, in which the current instruction just fetched from the imem array is transmitted on the E communication line. Upon completion of this communication action, a second communication action must be completed on the E communication line, namely the communication action labelled E2 in FIG. 2a. These communication actions E1 and E2 will be discussed below in connection with the EXEC process.

Turning now to the EXEC process defined in FIG. 2a, there are a number of operations which are repeated forever, beginning with the communication action E1, followed by a number of guarded commands in which the operation code of the current instruction i is determined and concluding with the communication action E2.

In the first step, in the communication action E1 the EXEC process receives the instruction word transmitted by the FETCH process in this same communication action, holding it as a variable j. Then, a series of guarded commands follow.

The first guarded command in the EXEC process of FIG. 2a is:

alu(j.op)→E2;Xs*Ys*AC!j.op*ZAs.

This defines an operation of several steps. First, a determination is made whether the op code of the instruction j is an alu operation, in accordance with the notation alu(j.op). Such alu instructions are defined in the tables of FIG. 1b. If it is an alu op code, then the E2 communication action with the FETCH process is completed by the EXEC process, which frees the FETCH process to continue its operations defined above. The next step for the EXEC process is to perform the following communication actions concurrently: Xs, Ys, ZAs and a communication on the AC communication line of FIG. 1a. The communication actions Xs, Ys and ZAs control the registers of FIG. 1a whose process REGISTER is defined in Lines 12–17 of FIG. 2b. The AC communication controls the arithmetic logic unit or ALU process of FIG. 1a, which is defined in Lines 1–4 of FIG. 2b. The control of the registers by the communication actions Xs, Ys and ZAs shall now be described.

Referring to Line 12 of FIG. 2b, the REGISTER process performs the following operation which is repeated forever concurrently with the Xs communication:

REG[k]≡(*[[¬bk∧k=j.x∧$\overline{Xs}$→X!r*Xs]].

The meaning of this definition is as follows: in the kth one of all of the registers, if a local lock, called bk is not turned on and if the street address k of the kth register is equal to the value contained in the x field of the current instruction j, and if the EXEC process has extended the handshake or communication action Xs on the Xs communication line, then the kth register transmits its contents r on the X bus of FIG. 1a concurrently with the completion of the communication action Xs on the Xs communication line of FIG. 1a.

Simultaneously, the Ys communication action extended by the EXEC process of FIG. 2a calls for the following operation to be performed by the REGISTER process of FIG. 2b:

||*[[¬bk∧k=j.y∧ $\overline{Ys}$→Y!r*Ys]].

This definition means that for a kth one of all of the registers of FIG. 1a, if a local lock called bk associated with the kth register is off, and if the y field of the instruction j contains the value of the street address k of the kth register and if the communication action Ys has been extended by the EXEC process, then the content r of the kth register is transmitted on the Y bus concurrently with the completion of the communication action Ys between the REGISTER and EXEC processes. It should be noted that the steps performed by the REGISTER process are all performed in parallel, as required by the parallel vertical lines separating each of these steps, and that step is repeated forever. Thus, the value of k in the various steps of the REG k process is different for different steps.

Turning now to the ALU process, the ALU process is defined in the first four lines of FIG. 2b as follows:

$$ALU \equiv \; * \, [[ \, \overline{AC} \rightarrow AC?op \cdot X?x \cdot Y?y;$$
$$(z,f): = aluf(x,y,op,f); ZA!z$$
$$\overline{F} \rightarrow F!f$$
$$]].$$

The definition means that the ALU responds, whenever there is a communication action extended by the EXEC process on the AC communication line of FIG. 1a, by receiving on the AC communication line the op code of the current instruction concurrently with the receipt of the contents of the two registers transmitted on the X and Y buses as the variables x and y, respectively. The next step is to perform an ALU function defined by the op code of the current instruction on the two operands x and y and store the result as z. Such an operation may also generate a flag f which must be stored. As is well known to those skilled in the art, one example of flag f may arise when the ALU operation is an addition and creates a carry bit. The flag f would signify the value of the carry bit. The next step performed by the ALU process is to transmit the result z on the ZA bus. The communication action ZAs extended by the EXEC process ensures that the result z is stored in the appropriate one of the registers.

Storing of the result z is accomplished in the fourth parallel operation of the REG k process as follows:

$$\|*[[ \, \neg bk \wedge k = j.z \wedge [\overline{ZAs} \rightarrow bk\uparrow; ZAs; ZA?r; bk\downarrow]].$$

The meaning of this definition is as follows: repeat forever the following operation: if the local lock bk for the kth register is not on, and if the z field of the current instruction j is equal to the street address of the kth register and if there is a communication action pending on the ZAs communication line of FIG. 1a from the EXEC process, then the local lock bk for the kth register is turned on. The next step is to complete the ZAs communication action by the REGISTER process with the EXEC process. This frees up the EXEC process to continue on with its next operations. The next step performed by the REGISTER process is to receive into the kth register the data transmitted on the ZA bus of FIG. 1a, namely the result z generated by the ALU process. The final step is to unlock the kth register by turning off the local lock bk. Again, the value of k in this operation is different from the value of k in the other parallel operations of the REGISTER process.

The next guarded command performed by the EXEC process is:

$$\|d(j.op) \rightarrow E2; Xs \cdot Ys \cdot MC1 \cdot ZRs.$$

In this operation, the EXEC process determines whether the op code of the current instruction j is a load instruction, in accordance with the definition of Table 2 of FIG. 1b. If so, the EXEC process completes the communication action E2 with the FETCH process. It then issues the following concurrent communication actions: Xs, Ys, MC1 and ZRs.

The results of the Xs and Ys communication actions have been discussed previously in connection with the previous guarded command performed by the EXEC process and need not be repeated here. Basically, the contents of two registers designated by the x and y fields of the current instruction j are output on the X and Y buses. The communication action MC1 refers to a guarded command performed by the memory unit process of FIG. 1a which is defined in Lines 5–8 of FIG. 2b.

Referring to the memory unit (MU) process definition of FIG. 2b, the communication action MC1 initiated by the EXEC process refers to the first guarded command given for the memory unit (MU) process of FIG. 2b as follows:

$$MU \equiv *[[ \overline{MC1} \rightarrow X?x \cdot Y?y \cdot MC1; ma: = x+y; MD1?w; ZM!w.$$

This means that whenever the EXEC process initiates the communication action MC1 on the MC communication line of FIG. 1a connecting the EXEC process with the memory unit process, the memory unit process responds by concurrently receiving the values transmitted on the X and Y buses by the REGISTER process. Concurrently, the memory unit process completes the communication action MC1. The next step performed by the memory unit process is to add the variables x and y received on the X and Y buses, the sum being defined as a memory address ma. The next step performed by the memory unit process is to receive from a data memory (not shown in FIG. 1a) on the communication line MD1 the contents w of the data memory array stored at the memory address ma. The final step performed by the memory unit process in this operation is to transmit w on the ZM bus. This completes the operations performed by the memory unit process in response to the communication action MC1 from the EXEC process.

Returning to the EXEC process, the communication action ZRs initiated by the EXEC process on the ZRs communication line of FIG. 1a affects the REGISTER process in a manner analogous to that of the communication action ZAs discussed previously above. Specifically, referring to Line 5 of the definition of the REGISTER process of FIG. 2b, the communication action ZRs prompts the following operation:

$$\|*[[ \, \neg bk \wedge k = j.z \wedge \overline{ZRs} \rightarrow bk\uparrow; ZRs; ZM?r; bk\downarrow]].$$

The meaning of this definition is as follows: repeat forever the following process: if the local lock bk for the kth register is off, and if the z field of the current instruction j is equal to the street address k of the kth register and if the EXEC process has initiated a communication action on the ZRs communication line with the REGISTER process, then the local lock bk is turned on. Next, the ZRs communication action is completed by the REGISTER process with the EXEC process, freeing the EXEC process to proceed on to other matters. Next, the REGISTER process receives and stores in the kth register the data transmitted on the ZM bus by the memory unit (MU), which was the contents of the data memory at address ma. Next, the local lock bk is turned off, thus freeing this register for future operations.

The next guarded command performed by the EXEC process of FIG. 2a is as follows:

$$\|st(j.op) \rightarrow E2; Xs \cdot Ys \cdot MC2 \cdot ZWs.$$

The meaning of this definition is as follows: the EXEC process determines whether the op code field of the current instruction j corresponds to a store instruction, as defined in Table 2 of FIG. 1b. If so, the E2 communication action is completed with the FETCH process. Thereafter, the EXEC process immediately initiates the following concurrent communication actions: Xs, Ys, MC2 and ZWs. The effects of the Xs and Ys communication actions on the REGISTER process have been discussed previously and need not be described again. The concurrent communication action ZWs initiated by the EXEC process calls for the following operation in the REGISTER process:

$$\|*[[\neg bk \wedge k=j.z \wedge \overline{ZWs} \rightarrow ZM!r \cdot ZWs]].$$

The meaning of this operation performed by the REGISTER process is as follows: if the local lock bk of the kth register is turned off and if the z field of the current instructions j contains the street address of the register k and if the communication ZWs is pending on the ZWs line from the EXEC process, then the contents r of the kth register is transmitted on the ZM bus concurrently as the communication ZWs is completed with the EXEC process.

The MC2 communication initiated by the EXEC process on the MC communication line shown in FIG. 1a with the MU process calls for the following guarded command of the MU process:

$$\overline{MC2} \rightarrow X?x \cdot Y?y \cdot MC2 \cdot ZM?w; ma:=x+y; MDs!w.$$

The meaning of this definition is as follows: if the EXEC process has initiated the communication action MC2 on the MC communication line, then the MU process receives the data transmitted on the X, Y and ZM buses while completing the communication action MC2. The data received on the ZM bus is held as the variable w. Next, the variables x and y received on the X and Y buses are summed to compute a memory address ma. Next, the data w is stored in the data memory at the memory address ma via the communication action MDs on the MDs line connecting the memory unit process of FIG. 1a with the data memory DMEM (not shown in FIG. 1a).

The next guarded command performed by the EXEC process is as follows:

$$\lfloor LDX(j.op) \rightarrow Xof \cdot Ys \cdot MC1 \cdot ZRs; E2.$$

In this command, the EXEC process determines whether the op code field of the current instruction j corresponds to a load x instruction ldx, as defined in Table 2 of FIG. 1b. If so, the EXEC process refrains from completing the communication action E2 with the FETCH process, thus stalling the FETCH process temporarily. Instead, the EXEC process issues the following concurrent communication actions:

$$Xof \cdot Ys \cdot MC1 \cdot ZRs.$$

The results of the communication actions Xs, MC1 and ZRs have been described previously in connection with other guarded commands of the EXEC process and therefore will not be described again. The communication action Xof is initiated on the Xof communication line of FIG. 1a between the EXEC and the PCADD processes. In response, the last guarded command performed by the PCADD process is as follows:

$$\|*[[\overline{Xof} \rightarrow X! \text{offset} \cdot Xof]]).$$

The meaning of this operation performed by the PCADD process is as follows: repeat forever the following steps: if a communication is initiated by the EXEC process on the Xof communication line, then the PCADD process transmits the value of the offset register on the X bus while concurrently completing the communication action Xof with the EXEC process.

The ldx guarded command of the EXEC process being discussed here is similar to the ld command discussed previously in connection with the EXEC process. The difference is that what is transmitted by the ldx command on the X bus is the value of the offset register in the PCADD process.

Completion of the E2 communication with the FETCH process is postponed until the completion of all communications in this particular step. This prevents the value of the offset register in the PCADD from being changed by the guarded command performed by the FETCH process described previously herein, before completion of the requisite actions by the EXEC process.

The next guarded command performed by the EXEC process is as follows:

$$\lfloor stx(j.op) \rightarrow Xof \cdot Ys \cdot MC2 \cdot ZWs; E2.$$

The meaning of this definition is as follows: the EXEC process determines whether the op code field of the current instruction j corresponds to a store x instruction as defined in Table 2 of FIG. 1b. If so, the following concurrent communication actions are performed: Xof, Ys, MC2 and ZWs. The effects of each of these concurrent communication actions have been described previously in connection with other guarded commands performed by the EXEC process described above herein. Specifically, the Xof communication action has been described above in connection with the ldx guarded command, the Ys communication action has been described above in connection with the ALU guarded command, the MC2 communication action has been described above in connection with the st guarded command as has the ZWs communication action. The overall effect, therefore, of the guarded command that begins with stx(j.op) is to transmit the offset register contents on the X bus, transmit the contents of the register designated by the y field of the current instruction on the Y bus, transmit the contents of the register designated in the z field of the current instruction on the ZWs bus and store it in the data memory array DMEM at the memory address equal to the sum of the two operands transmitted on the X and Y buses. Again, because this operation involves the current value of the offset register in the PCADD process, the EXEC process postpones completion of the communication action E2 with the FETCH process until this operation has been completed, thereby avoiding any premature change in the value of the offset register by the guarded command performed by the FETCH process discussed above.

The next guarded command performed by the EXEC process is as follows:

$$lda(j.op) \rightarrow Xof \cdot Ys \cdot MC3 \cdot ZRs; E2.$$

The meaning of this definition is as follows: the EXEC process determines whether the op code field of the current instruction j specifies a load address command, as defined in Table 2 of FIG. 1b. If so, the following concurrent communication actions are initiated by the EXEC process: Xof, Ys, MC3 and ZRs. The concurrent communication actions Xof, Ys and ZRs have been explained above in connection with other guarded commands performed by the EXEC process. As before, the Xof communication action permits the PCADD process to output the contents of the offset register on the X bus, while the Ys communication action causes the register specified by the y field of the current instruction to output its contents on the Y bus. The MC3 communication action prompts the following guarded command performed by the memory unit (MU) process as defined in FIG. 2b:

$$\overline{MC3} \rightarrow X?x \cdot Y?y \cdot MC3; ma:=x+y; ZM!ma.$$

The meaning of this guarded command performed by the MU process is as follows: if the EXEC process has initiated the communication action called MC3 on the MC communication line of FIG. 1a connecting the EXEC unit with the MU process, then the memory unit (MU) process receives the data transmitted on the X and Y buses as variables x and y. At the same time, the memory unit process completes the communication action MC3. Then the memory unit process computes a memory unit address ma=x+y and transmits this address on the ZM bus. The concurrent communication action ZRs, as discussed previously herein, causes the data transmitted on the ZM bus to be stored in the register specified in the z field of the current instruction. It is not until the completion of all four of these concurrent communication actions that the EXEC process finally completes the communication action E2. As before, the reason for this is because the current operation involves the contents of the offset register of the PCADD process, and therefore the FETCH process must be temporarily stalled in order to prohibit premature change in the contents of the offset register. Also, as before, the local lock bk of the register specified by the z field of the current instruction is turned on to avoid concurrent use of that register in a subsequent step which may employ the register as an operand register.

The next guarded command performed by the EXEC process is defined in FIG. 2a as follows:

|stpc(j.op)→Xpc•Ys•AC!add•ZAs;E2.

The definition of this operation means the following: the EXEC process determines whether the op code of the current instruction j specifies a store pc instruction, as defined in Tables 1 and 2 of FIG. 1b. If so, the EXEC process performs the following concurrent communication actions: Xpc, Ys, ZAs and AC. Referring to the PCADD process defined in FIG. 2a, the Xpc communication action initiated by the EXEC process on the Xpc communication line illustrated in FIG. 1a prompts the following guarded command performed by the PCADD process:

|Xpc→X!pc•Xpc.

This guarded command performed by the PCADD process consists of the following: if the PCADD process senses that the EXEC process has initiated a communication on the Xpc line (connecting the PCADD process with the EXEC process as shown in FIG. 1a), the PCADD process responds by outputting the current value of the program counter pc on the X bus concurrently with completing the Xpc communication action with the EXEC process. As before, the Ys communication action causes the register specified by the y field of the current instruction to output its contents on the Y bus. The AC communication, namely: AC!add, performed by the EXEC process in this operation consists of the EXEC process transmitting to the ALU process a command called "add" which causes the ALU to add the two operands which it has received.

The ALU process, as discussed previously, responds to the communication action AC by receiving the op code "add" on the AC communication line and the operands transmitted on the X and Y buses. The ALU then adds two operands and outputs the sum on the ZA bus, as discussed previously in connection with the definition of the ALU process given in FIG. 2b. Also, as discussed previously above, the ZAs communication action causes the sum output on the ZA bus to be stored in the register designated in the z field of the current instruction. As before, the local lock on this register is activated during this operation in order to prevent this register from being used in a subsequent operation as an operand register. Also, because the current operation involves obtaining the current value of the pc counter from the PCADD process, completion of the communication action E2 by the EXEC process with the FETCH process is postponed until the foregoing operation has been completed, in order to prevent the PCADD process from prematurely updating the program counter pc. In this embodiment of the invention, the store pc instruction stores the program counter in a selected one of the registers by sending it through the ALU, which permits the program counter pc to be added to an arbitrary number prior to being stored in the designated register.

The next guarded command performed by the EXEC process according to the definition of FIG. 2a is as follows:

|jmp(j.op)→Ypc•Ys;E2.

This operation is as follows: the EXEC process determines whether the op code of the current instruction specifies the jmp instruction, defined in Tables 1 and 2 of FIG. 1b. If so, the EXEC process issues the concurrent communication actions Ypc and Ys. Thereafter, the EXEC process completes the communication action E2 with the FETCH process. As before, the Ys communication action causes the register specified in the y field of the current instruction to output its contents on the Y bus. The Ypc communication action initiated by the EXEC process enables the following guarded command of the PCADD process:

|Ypc→Y?pc•Ypc.

In this operation, the PCADD process-senses a communication action pending on the Ypc communication line (connecting the EXEC process with the PCADD process shown in FIG. 1a). In response, the PCADD process replaces the contents of the program counter pc with the data received on the Y bus. Concurrently, the PCADD process completes the communication action Ypc. As before, the completion of the E2 communication action is postponed until the completion of the foregoing operation, in order to avoid any change being made in the program counter pc by the PCADD process prior to the completion of this operation.

The last guarded command performed by the EXEC process in FIG. 2a begins with the following:

|brch(j.op)→F?f;[cond(f,j.cc)→PCA1;PCA2 . . .

This operation is as follows: the EXEC process determines whether the op code field of the current instruction specifies a branch instruction, as defined in Tables 1 and 2 of FIG. 1b. If so, then the EXEC process initiates a communication action on the line F (connecting the EXEC process with the ALU process as shown in FIG. 1). In this communication action, the EXEC process is ready to receive a flag f on the communication line F. Turning to the ALU process as defined in FIG. 2b, the ALU process performs the following guarded command:

|F→F!f.

In this operation, the ALU process responds to the pending communication request by the EXEC process on the F bus by transmitting flag f on the communication line F. Returning to the EXEC process, the next step is as follows: the EXEC process determines whether the condition is met that the value of the flag f is equal to the condition code field of the current instruction. If so, the EXEC process initiates the communication action PCA1 on the PCA line connecting it with the PCADD process, shown in FIG. 1a. This enables the PCADD process to perform the following guarded command shown in FIG. 2a:

|PCA1→PCA1;y:=pc+offset;PCA2;pc:=y.

This operation of the PCADD process is as follows: upon sensing a pending communication action PCA1, the PCADD process completes the communication action PCA1 with the EXEC process. It then adds the value of the offset register to the program counter, calling the resulting sum y. It then completes the communication action PCA2 with the EXEC process. This frees the EXEC process to continue on with its subsequent tasks. In the meantime, the next step performed by the PCADD process is to replace the program counter with the new value y, thus in effect incrementing the program counter by the value of the offset register. The next command, i.e. skip, performed by the EXEC process ensures that the EXEC process will not wait forever until it finds a flag value f satisfying the condition code field of the current instruction. Finally, the EXEC process completes the communication action E2 with the FETCH process. The completion of the communication action E2 by the EXEC process is postponed until the completion of the foregoing operation because at least part of the foregoing operation involves the PCA1 communication requiring the use of the most current values of the program counter pc and the offset register. Therefore, it is required that these values not be changed until completion of the current operation. This is enforced by postponing the completion of the communication action E2, as shown in FIG. 2a.

As can be seen from the foregoing, the EXEC process first determines which type of instruction the current instruction is. ALU instructions cause the ALU to add the two operands designated by the x and y fields of the current instruction and output them on the ZAs bus. The load instruction causes the memory unit process to fetch the contents of the data memory at the address specified by the sum of two registers designated by the x and y fields of the current instruction and to load that contents into a register specified by the z field of the current instruction. The store instruction does just the opposite, namely storing the contents of a register designated in the z field of the current instruction at a location the data memory specified by the sum of the registers designated by the x and y fields of the current instruction. The load x instruction is nearly the same as the load instruction with the exception that the contents of the offset register is substituted in place of the contents of the register otherwise specified in the x field of the current instruction. The store x instruction is nearly the same as the store instruction with the exception that the content of the offset register is substituted for the content of the register otherwise specified by the x field of the current instruction. The load address instruction causes the sum of the offset register and a register designated by the y field of the current instruction to be stored in the register designated by the z field of the current instruction. The store pc instruction causes the ALU process to add the program counter pc with the contents of a register specified by the y field of the current instruction and stores the resulting sum in a register specified by the z field of the current instruction. The jump instruction simply replaces the program counter with the contents of a register specified by the y field of the current instruction. Finally, the branch instruction compares the current flag value f produced by the ALU process with the condition code field of the current instruction. If the two compare, this causes the PCADD process to add the contents of the offset instruction to the program counter.

IMPLEMENTATION

Next we explain how the preferred embodiment described in the previous sections can be transformed (implemented) into a network of logical operators, usually called "gates." We also describe a preferred embodiment of the gates in CMOS technology.

The implementation of the program embodiment of the processor into a network of gates is drastically simplified by the application of a general "divide-and-conquer" strategy: Each process is decomposed in two parts, a "control part" and a "data part." The control part is the part of the process that realized the sequencing of the actions inside the process. The data part is the part that realizes the actual data manipulation, such as storing values into registers, arithmetic operations, etc. The data part also contains all registers and the buses.

The procedure for decomposing a process into control and data parts is systematic and general. Control and data parts are first implemented independently. Then they are connected together by including the data parts in the handshake mechanism that implements the communications between processes.

Control Part

The control part of a process is obtained by the following transformations on the program description of the process: First, each communication command involving message input or output is replaced with a "bare" communication on the channel; for instance, input action C?x and output action C!x would both be replaced with the bare communication command C.

Second, all assignment statements are delegated to subprocesses. Assignment S is replaced with a communication command on a new channel, say Cs, and the subprocess *[[ $\overline{Cs} \rightarrow S \cdot Cs$ ]] is introduced. The subprocess can be described as follows: A request from the original process to compute S results in the probe $\overline{Cs}$ changing value from false to true. This is the signal for the subprocess to compute S and complete the communication Cs, by which the original process is informed that the computation of S has been executed.

After these transformations, the control part of each process consists only of boolean expressions in selection and repetition commands and of communication commands. Thus, the next step is to implement each communication command with a handshake protocol mechanism, and to implement the sequencing means among the communication commands inside a process.

The control part of the whole processor is the combination of the control parts of the different processes and the handshake wires between them, which we describe in the next section.

Handshake Protocols

Figure 3A:
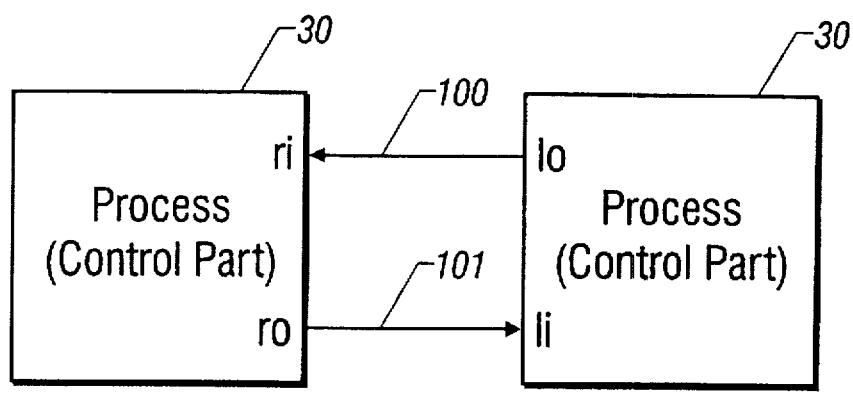
FIG. 3a shows the interconnection of two control processes using handshake signals.

A typical embodiment of the communication mechanism in the control parts of the processes is shown in FIG. 3a. The control parts of the two processes 30 and 40 communicate with each other by a common channel. Let R be the name of the port to the channel in 30, and let L be the name of the port to the channel in 40. The bare communication across the channel is implemented by a sequence of elementary signals on two wires implementing the bare channel. Such a sequence of signals is called a "handshake protocol."

The channel is implemented by two handshake wires: wire 100 and wire 101. The input side of wire 100 is variable lo and the output side of the wire is variable ri. The input side of wire 101 is variable ro and the output side of the wire is variable li, as indicated in FIG. 3a. We use a four-phase, or "return-to-zero" handshaking protocol. Such a protocol is not symmetrical: All communications in one process are implemented as active and all communications in the other process as passive.

(We shall see when we connect control and data parts that, for reasons of efficiency, all input actions are implemented as active and all output actions as passive.)

The passive implementation of a bare communication command is:

[ri];ro↑;[¬ri];ro↓(passive)

(The passive protocol starts with the wait action [ri], i.e., "await until the input side ri of wire 100 is set to true". The active protocol starts with lo ↑, i.e., "set the output side lo of wire 100 to true".)

The active implementation of a bare communication command, called lazy active, is:

[¬li];lo↑;[li];lo↓(lazy active).

In order to understand the functioning of the protocol, let us first look at how signals are propagated along a wire. Consider, for instance, wire 100 of FIG. 3a. The input side of the wire is variable lo and the output side of the wire is variable ri. If we start with all variable values being false. (We also say that all wires are "low.") Then, action lo↑ set lo to true, i.e., raises the input side of the wire. The signal propagates along the wire, and eventually the output side is raised, i.e., variable ri becomes true. After this point, the wait action [ri] can terminate.

With this ordering of signals imposed by the wires, if we start with all wires low, the concurrent execution of the passive and active sequences realizes the following interleaving of signal transitions:

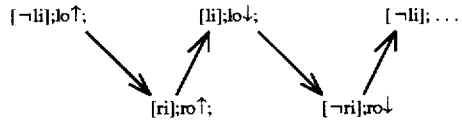

This interleaving of the signal transitions of process 30 with the signal transitions of process 40 realizes the coincident execution of the two communication actions.

Observe that the completion of ro↓—i.e., the return to zero of wire 100—is detected by process 40 only as the first action [¬li] of the following lazy-active sequence. This particularity of the lazy-active-passive protocol leads to an important gain in efficiency when data transmission is involved. In such a case, half of the transmission delays and half of the completion trees delays can overlap with the part of the computation between two consecutive handshakes.

The lazy-active protocol cannot be used when an input action is probed—such as action AC?op in the ALU—because the probe requires a passive protocol. For those cases, we have designed a special protocol that requires three wires.

Combining Control and Data Parts

Figure 3B:
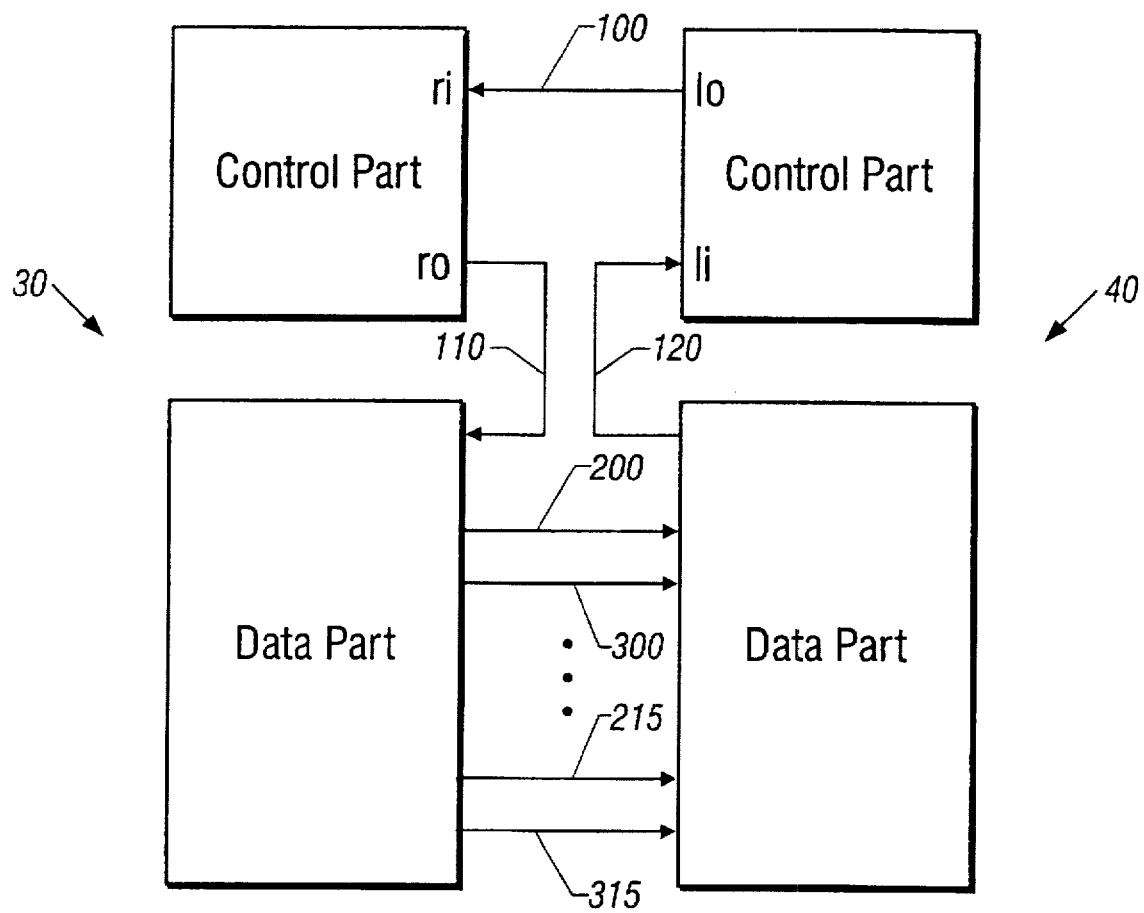
FIG. 3b shows the same two control processes but with one control signal broken and a data part inserted.

FIG. 3b shows how the data part is combined with the control part. Assume that the complete communication action in process 30 is the output action R!u on port R, and the complete communication action in process 40 is the input action L?v on port L.

In order to implement the invalid value of the data, the bits of the communication channel between the two registers (the "data wires") are dual-rail encoded. Each pair of wires (200, 300), (201, 301), ..., (215, 315), encodes the bits 0, 1, ..., 15 of the data path. For each bit, both wires being low (0,0) corresponds to the invalid value. One wire being high and the other one low (0,1) or (1,0) corresponds to the valid values true and false. The state where both wires are high is never used. (Although the dual rail encoding of the valid/invalid cycle is the preferred embodiment, many alternative encodings have been described in the literature.)

Wire 101 of FIG. 3a is "cut open", ro is used to assign the values of the bits of u to the dual-rail data wires, and li is set to true when all bits of v have been set to the values of the data wires. Each cell of a register contains and acknowledge wire (not shown) that is set to true when the bit of the cell has been set to a valid value of the two data wires, and reset to false when the data wires are both reset to false. Let vack$_i$ be the acknowledge of bit v$_i$, xi is set and reset as:

vack$_0 \wedge$vack$_1$ ... $\wedge$vack$_{15}$ ¬li↑

¬vack$_0 \wedge$ ¬vack$_1$ ... $\wedge$ ¬vack$_{15}$ ¬li↓

Since a 16-input C-element would be prohibitively slow to implement, the implementation is a tree of smaller C-elements, which we call a completion tree. In this embodiment of the processor, we use a two-level tree of 4-input C-elements. (See FIGS. 9 and 10.)

When data is transmitted via a bus, and when the completion tree is large, the gain of using a lazy-active protocol can be very important, since half of the data transmission delays and half of the completion-tree delays can overlap with the rest of the computation. Therefore, all input actions are implemented as lazy active.

Implementation of buses

The case when data is transmitted from process A to process B via a bus is more complicated. An important advantage of our implementation is that no arbitration is necessary: A and B are allowed to communicate via a bus only after the bus has been reserved for these two processes. Hence no device exhibiting metastability (see Reference 11 for an explanation) is necessary. The chief problem in implementing the buses is the distributed implementation of large multi-input OR-gates.

Figure 4A:
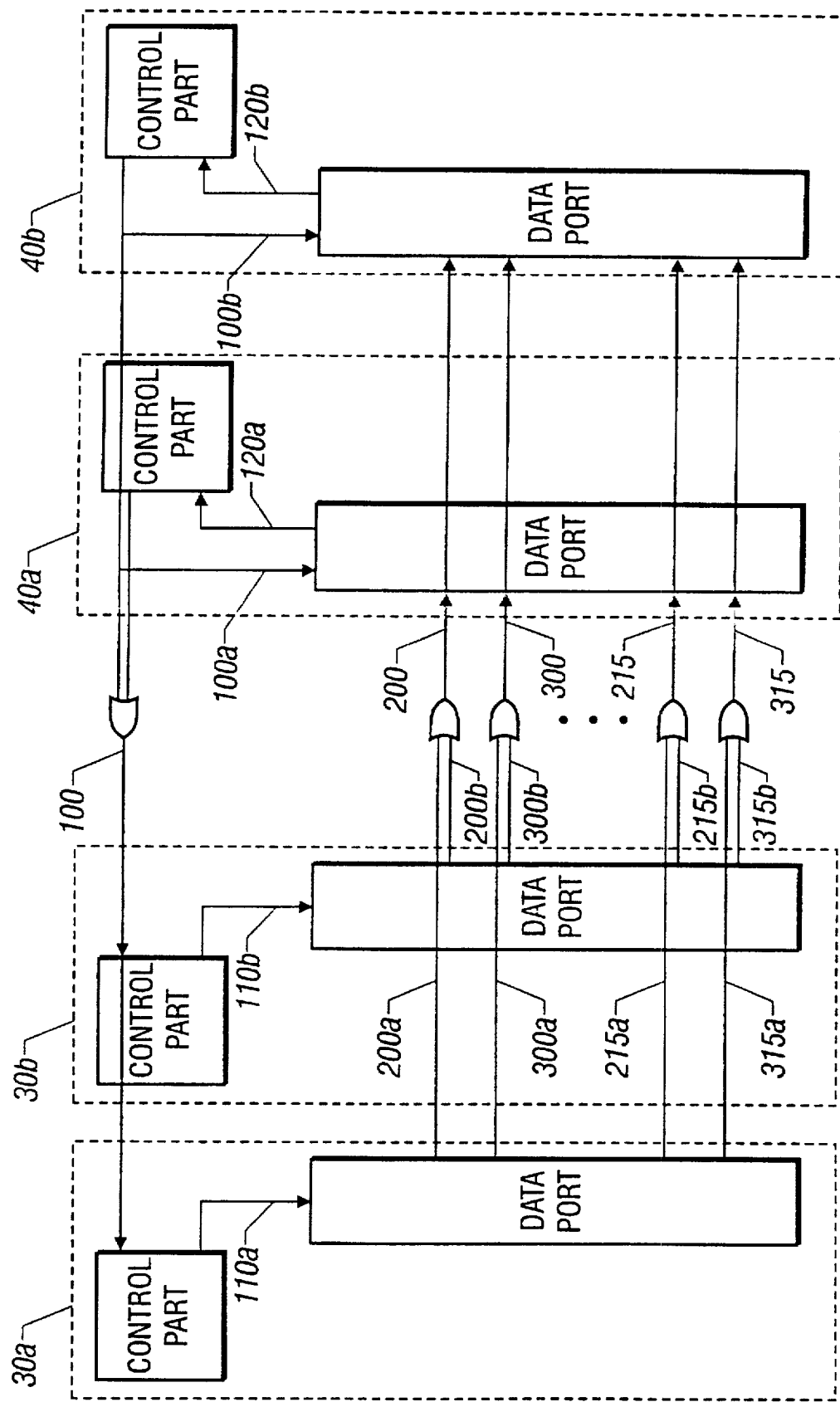
FIG. 4a depicts the bus structure that provides the means for transferring data from one of many registers of one bank to one of many registers of a second bank.

A typical embodiment of the register transfer mechanism in our invention is shown in FIG. 4a. Data is transferred from one of a plurality of sending processes, in this case the two processes 30a and 30b, to one of a plurality of receiving processes, in this case two processes 40a and 40b. The data transfer is initiated when either process 40a or process 40b issues a receive request by raising either signal 100a or signal 100b which in turn raises the handshake signal 100. A high-level on signal 100 causes either process 30a or process 30b (depending upon state information contained in each process) to send sixteen bits of dual-rail data on signals 200 through 215 (the one-rails) and signals 300 through 315 (the zero-rails). The data is sent by raising, for each bit, either the one-rail or the zero-rail. The requesting process (either 40a or 40b) then receives this data and causes signal 100a or 100b to lower, in turn lowering signal 100. The lowering of signal 100 effects the further lowering of all the dual-rail data signals 200 through 215 and 300 through 315. This sequence represents one valid/invalid cycle.

Figure 4B:
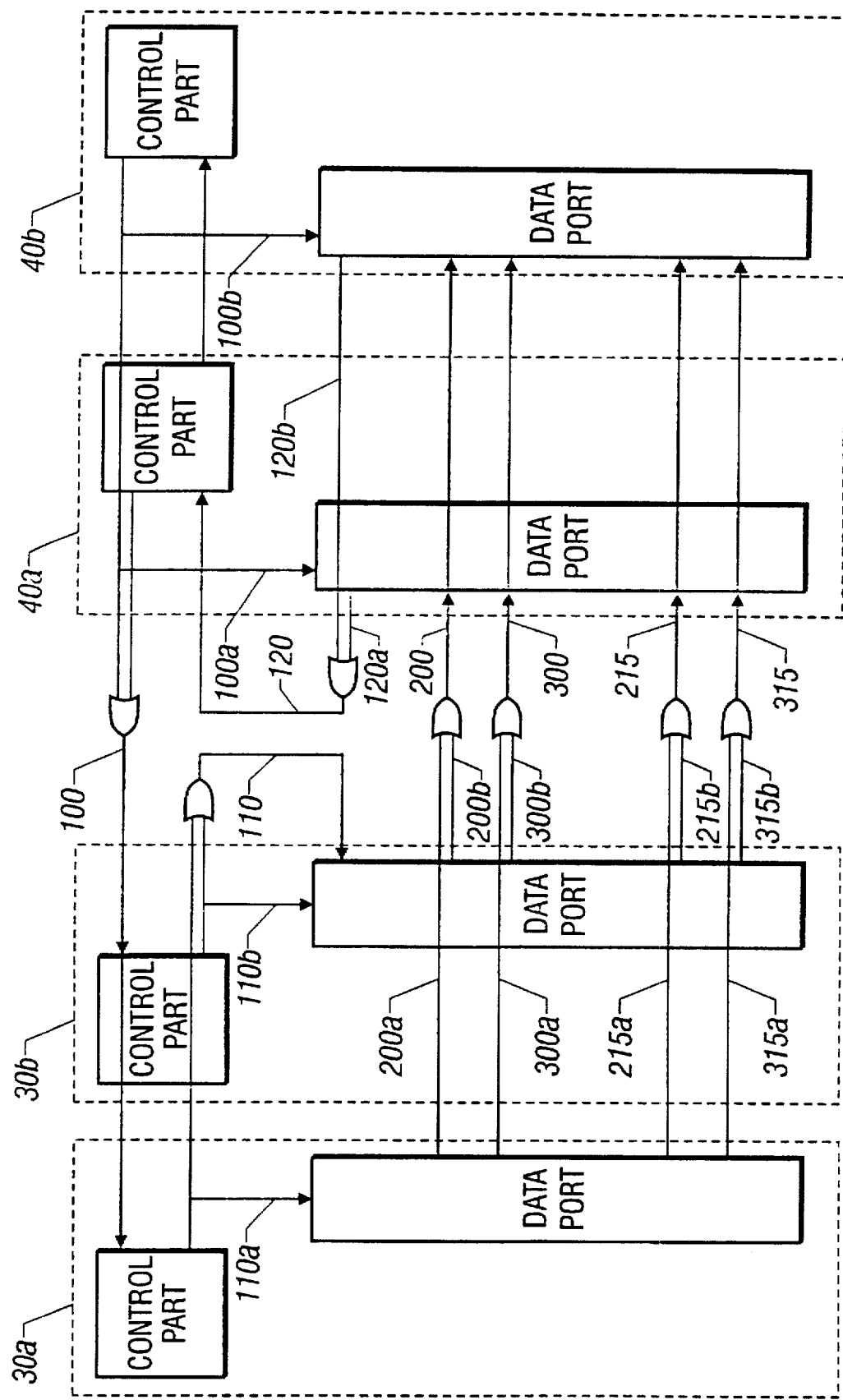
FIG. 4b depicts a similar bus structure that has been modified in order to function correctly with control units that issue the lazy-active-passive handshake protocol.

Our invention provides a modification to this protocol so that the receiving processes (40a or 40b) may go onto to perform another task without first receiving the final acknowledgement that all the dual-rail data signals have lowered. This final acknowledgement is detected later just before the next request for data is issued. In order to use this lazy-active-passive handshake protocol when there are a plurality of receiving units, the processes must be interconnected as shown in FIG. 4b. Rather than each receiving unit getting a local acknowledgement signal (e.g. 120a), the acknowledgement signals from all receiving units are merged together by means of the OR-gate that produces signal 120, and this global acknowledgement signal is connected to each receiving unit. Thus regardless of which receiving unit collected the previous datum, a receiving process must only observe that signal 120 is low before requesting the next datum. The bus structure of FIG. 4b also differs from that of FIG. 4a by the addition of a second OR-gate, this one producing signal 110. This signal has two uses: firstly, in a specific CMOS implementation of the bus structure, it is used as a precharge signal enabling the bus sending units to share all p-channel transistors; and secondly, it is used as a secondary acknowledgement signal allowing a single process to safely send and receive data on the same bus structure. After issuing a write communication, a process must wait for signal 110 to be low before it can issue a read communication on the same bus structure.

Figure 5:
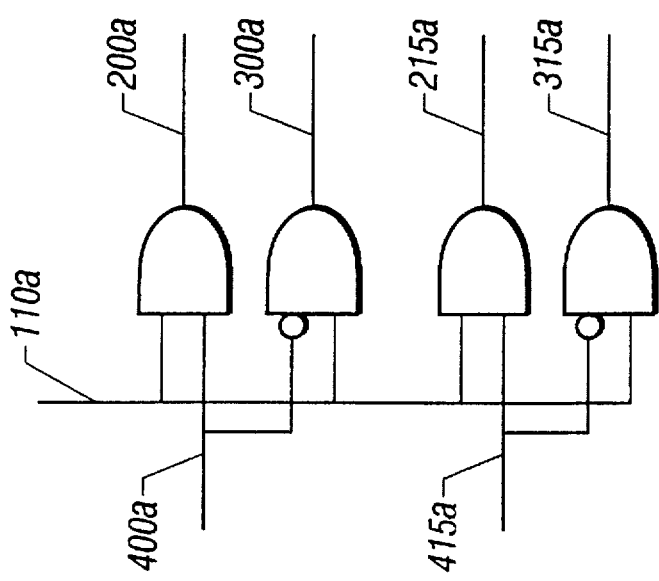
FIG. 5 shows a gate-level implementation of a typical bus sending unit.

FIG. 5 specifies a gate-level implementation of a sending unit. After signal 110a rises, either the one-rail (200 through 215) or the zero-rail (300 through 315) of each bit will rise, depending on the values of the binary-valued signals 400a through 415a. As long as these binary-valued signals don't change, the dual-rail signals will remain valid until signal 110a is subsequently lowered, after which all the dual-rail signals lower.

Figure 6:
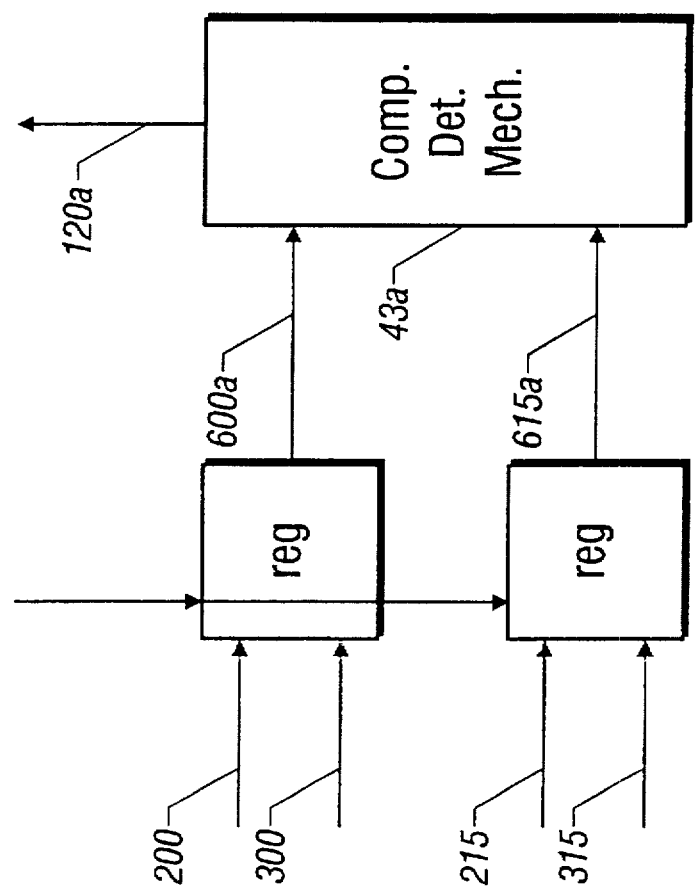
FIG. 6 shows a gate-level implementation of a typical bus receiving unit.

FIG. 6 shows a block diagram of a typical receiving unit. The receiving unit is composed of a plurality of enabled-registers, one for each bit, and a completion detection mechanism 43a. The enabled-registers operate as follows: signal 100a is raised enabling all bits of the receiving unit; then for each bit either the one-rail (200 through 215) or the zero-rail (300 through 315) rises, possibly changing the internal state of the register to the value just received. After the register has reached the proper state, completion signals are generated, one for each bit, on signals 600a through 615a. The completion detection mechanism 43a collects these completion signals and raises signal 120a after each internal signal has risen. After signal 120a has risen, signal 100a falls, disabling all bits of the receiving unit. The internal completion signals do not lower until after the dual-rail signals lower, and after they all lower the completion detection mechanism 43a lowers signal 120a.

Figure 7:
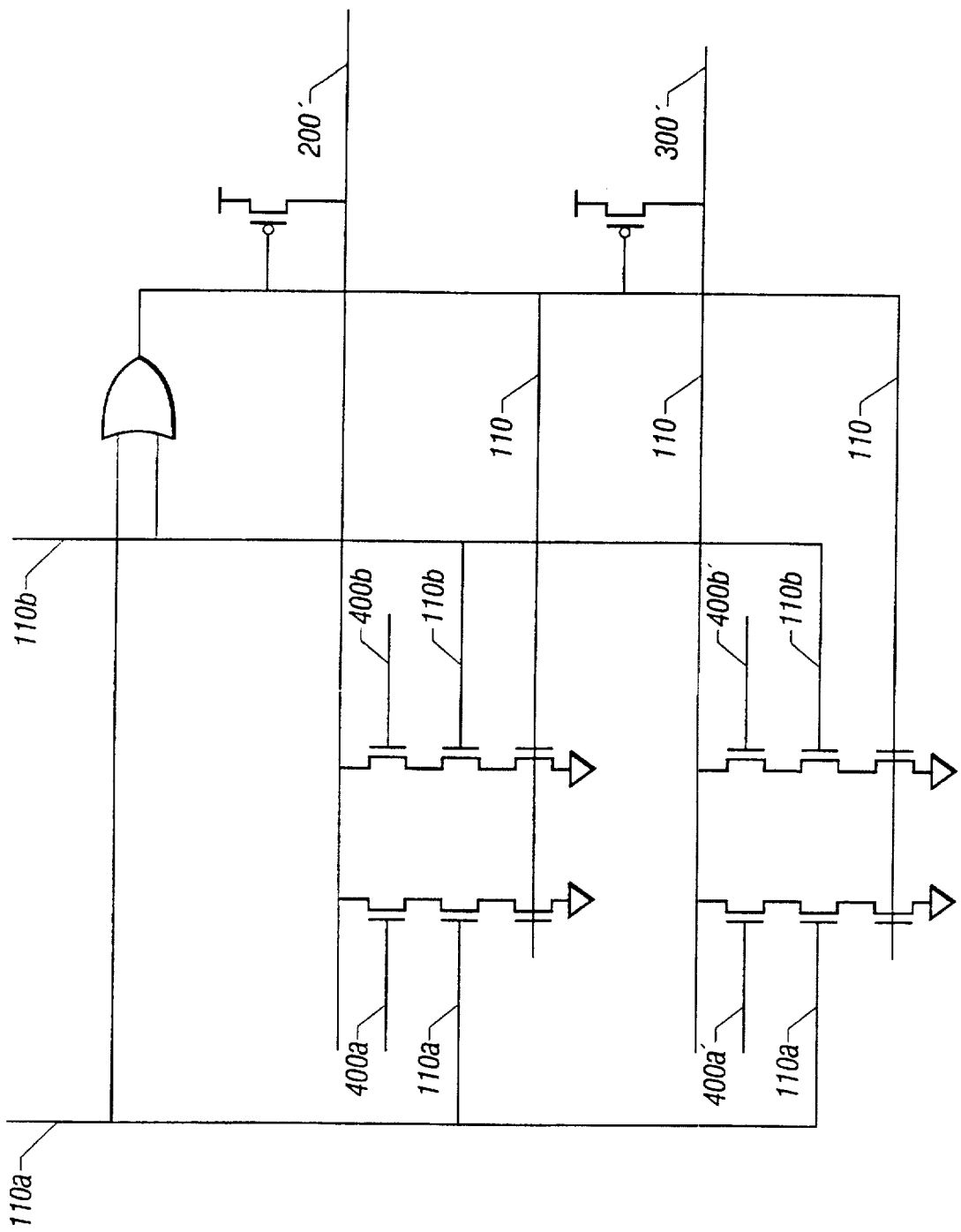
FIG. 7 shows a detailed CMOS implementation of a single bit of two combined sending units.

FIG. 7 shows a CMOS implementation of one bit of the pair of sending units 32a,32b and the OR-gates driving the dual-rail signals 200 and 300. In this implementation these dual-rail signals are inverted and they have been renamed 200' and 300', respectively. The general operation is thus: after either signal 110a or signal 110b has risen, lower either 200' and 300' depending on the binary-value of either 400a or 400b, then after the previously raised signal 110a or 110b falls, raise the previous lowered 200' or signal 300'. Specifically, if signal 110a rises, then after signal 110 rises, either signal 200' or signal 300' will lower. If the value of 400a is true (the value of an inverted copy 400a' is false), then signal 200' lowers because there is a conducting path through n-channel transistors to ground. If the value of 400a is false (the value of 400a' is true), then signal 300' lowers because there is a conducting path through n-channel transistors to ground. After signal 110a lowers, so does signal 110 and then either signal 200' or signal 300' will raise because there is a conducting path through a p-channel transistor to power.

Figure 8:
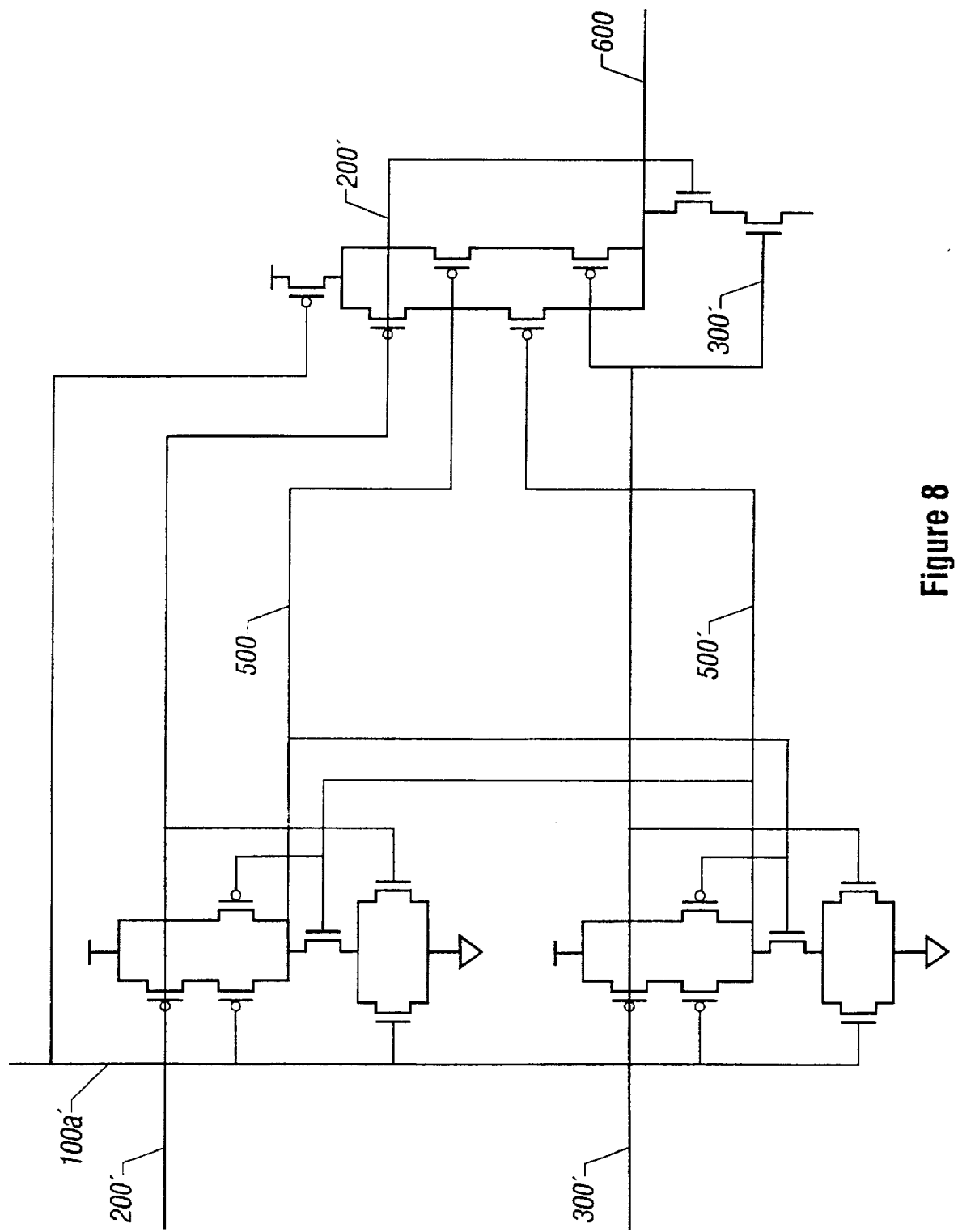
FIG. 8 shows a detailed CMOS implementation of a single bit of two combined receiving units.

FIG. 8 shows a CMOS implementation of one bit of the receiving unit 42a without the completion detection mechanism 43a. Signal 100a' is an inverted version of signal 100a. The general operation is thus: signal 100a' lowers, selecting this register; signal 200' or signal 300' lowers; the cross-coupled gates with output signals 500 and 500' possibly change state; completion signal 600 rises; signal 100a' rises; signal 200' or signal 300' rises; and completion signal 600 lowers. Specifically, if after signal 100a' lowers, signal 200' lowers signifying the transmittal of a one-value, and if signals 500 and 500' had values false and true respectively; the signal 500 would rise because of a conducting path to power through p-channel devices followed by signal 500' lowering because of a conducting path to ground through n-channel devices (gate signal 300' is high and gate signal 500 is high).

Once signals 100a', 200' and 500' are all low, signal 600 rises because there is a conducting path to power. Later, after signal 100a' rises and subsequently signal 200' rises, signal 600 falls because there is a conducting path to ground.

Figure 10:
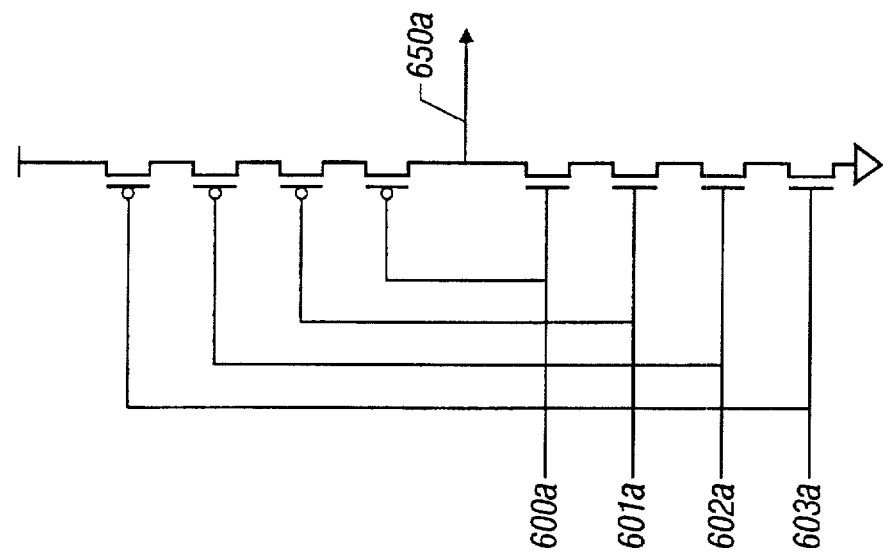
FIG. 10 shows a detailed CMOS implementation of the completion detection mechanism.
Figure 9:
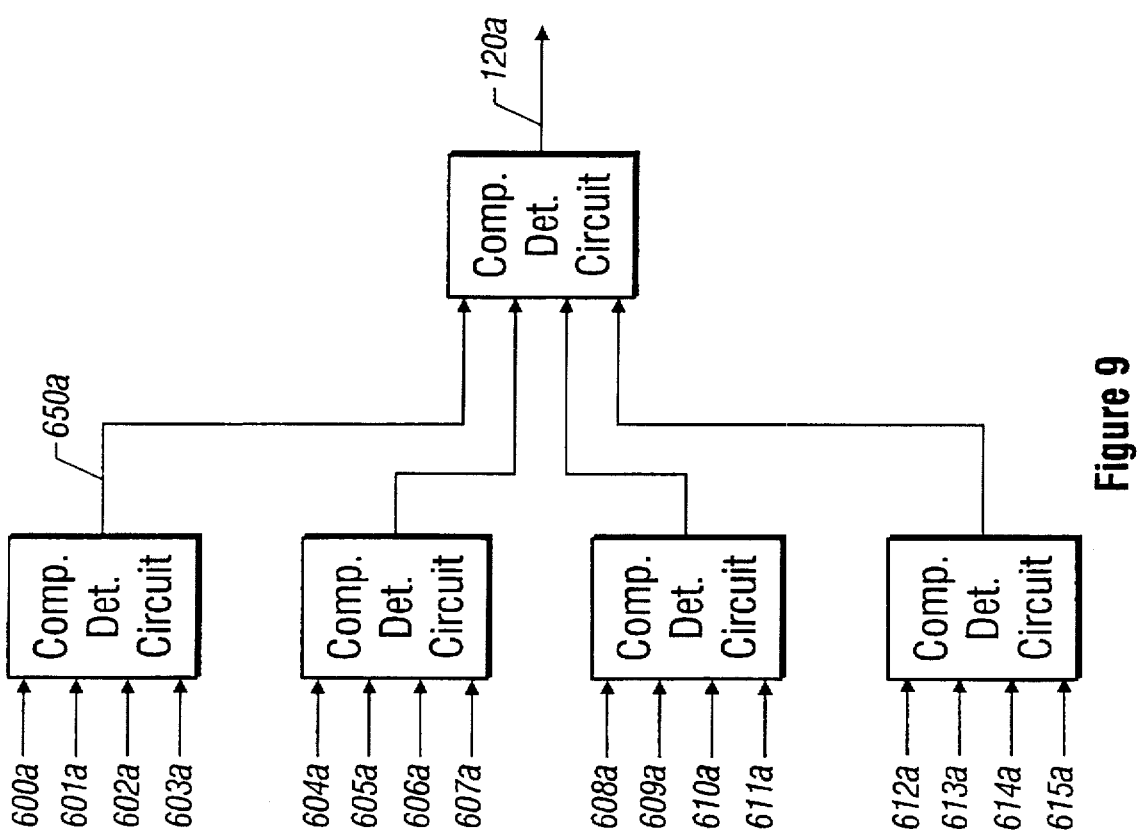
FIG. 9 shows a gate-level implementation of a typical completion detection mechanism.

FIGS. 9 and 10 show a possible embodiment of the completion detection mechanism 43a. FIG. 9 shows a gate-level schematic of a tree connected collection of individual completion detection circuits, usually referred to as (inverting) Muller C-elements. FIG. 10 show a detailed CMOS implementation of an individual completion detection circuit.

DESCRIPTION OF BUFFER

The typical control unit is the left-right buffer described by the program *[L;R]. If the communication action L is implemented with the lazy-active protocol and the communication action R is implemented with the passive protocol, the following sequence of handshake actions must be imposed by the control unit:

$$*[[\neg li];lo\uparrow;[li];lo\downarrow;[ri];ro\uparrow;[\neg ri];ro\downarrow]$$

One possible implementation of a control unit that imposes this sequence is the set of production rules:

$\neg li \wedge \neg s \wedge \neg ro \rightarrow lo\uparrow$ $lo \rightarrow s\uparrow$ $li \wedge s \rightarrow lo\downarrow$ $ri \wedge s \wedge \neg lo \rightarrow ro\uparrow$ $ro \rightarrow s\downarrow$ $\neg ri \wedge \neg s \rightarrow ro\downarrow$ While these rules specify a preferred embodiment, the only necessary orderings, in addition to the handshake protocols, are: the same occurrence of the transition lo↑ must precede each occurrence of the transition ro↑, and the previous occurrence of the transition ro↓ must precede each occurrence of lo↑. This we refer to as the minimal sequencing necessary to maintain correct sequencing of the data-part.

Figure 11:
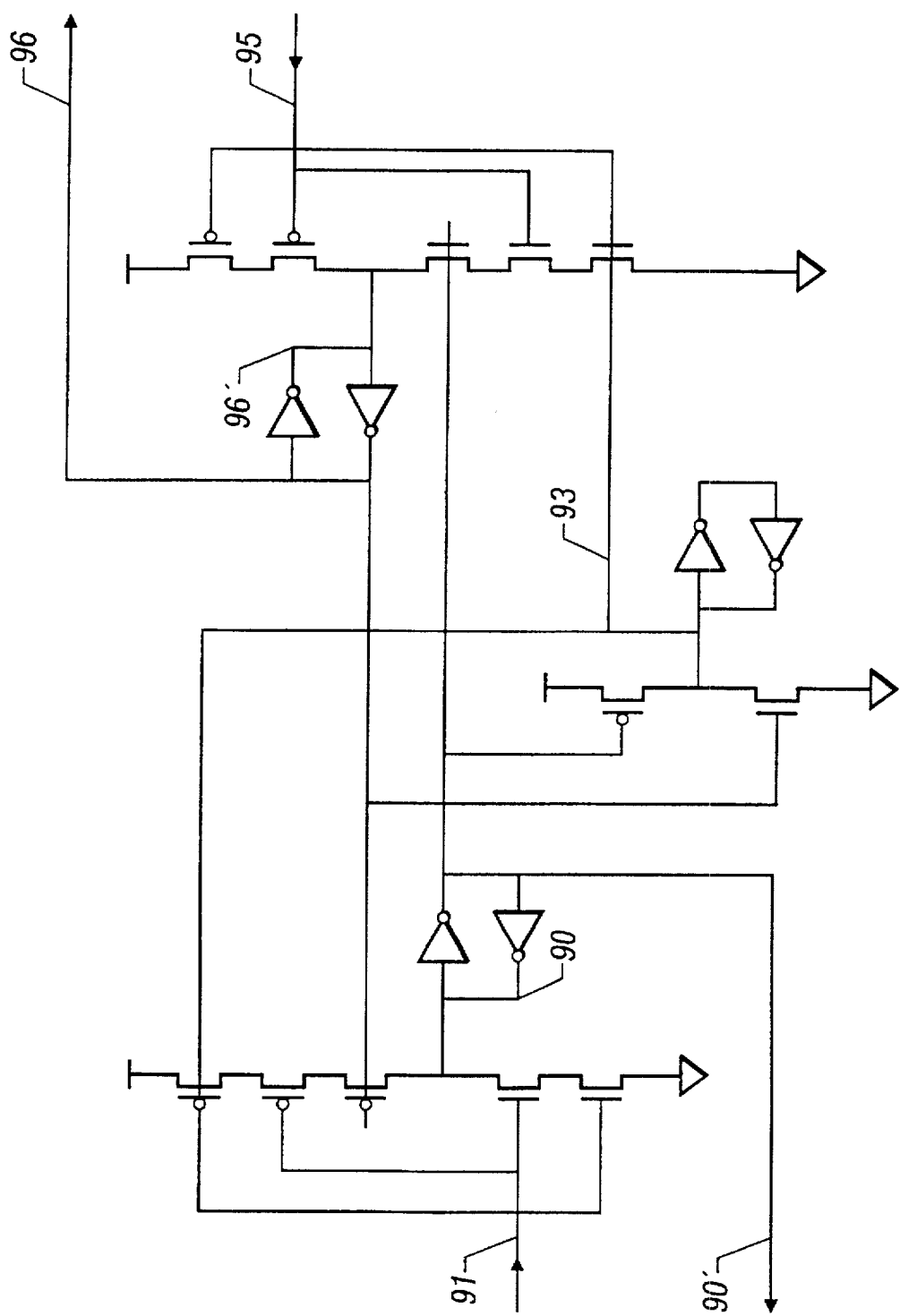
FIG. 11 shows a detailed CMOS implementation of a typical control process that implements the lazy-active-passive handshake protocol.

FIG. 11 shows a detailed CMOS implementation of the left-right buffer. This control unit repeatedly performs a lazy-active protocol on one communication channel and then performs a passive protocol on a second communication channel. The signals 90' and 91 represent the request/acknowledge pair ¬lo and li for the lazy-active (receive) communication L. The signals 95 and 96 represent the request/acknowledge pair ri and ro for the passive (send) communication. Signal 93 is internal to the control unit and is used to impose sequencing between the receive and send communication actions. The inverters that drive signals 96', 90 and 93 are used only to restore charge that may leak away from these storage nodes. These inverters must be weaker than and thus able to be overpowered by the series chains of transistors shown in the figure.

ALU

ALU control

In the ALU process, variable z is not needed to store the result of an ALU operation: the result can be put directly on the ZA bus. The first guarded command of the ALU of FIG. 2b process can be rewritten:

$$\overline{AC} \rightarrow AC?op\cdot X?x\cdot Y?y;\ \langle ZA,f \rangle := alu(x,y,op,f).$$

Hence, the control part is simply:

*[[$\overline{AC}$ → AC.X.Y; AL $\overline{F}$ → F

]].

(The assignment to f is omitted.) Communication command AL is the call of the subprocess evaluating aluf. The handshaking protocol of AL is passive because it includes an output action on the ZA bus: [ali];alo↑;[¬ali];alo↓. Hence, alo↑ is the "go" signal for the ALU computation proper.

The first guarded command has the structure of a canonical stage of the pipeline. Parameters are simultaneously received on a set of ports, and the result is sent on another port as in:

*[L?x;R!f(x)].

Such a process is called a left/right buffer. Since L is implemented as lazy active, and R as passive, it is a lazy-active/passive buffer. In the second design, where we have decomposed both the ALU and the memory processes into two processes in order to improve the pipeline, each stage of the pipeline is a lazy-active/passive buffer.

ALU data path

Figure 12:
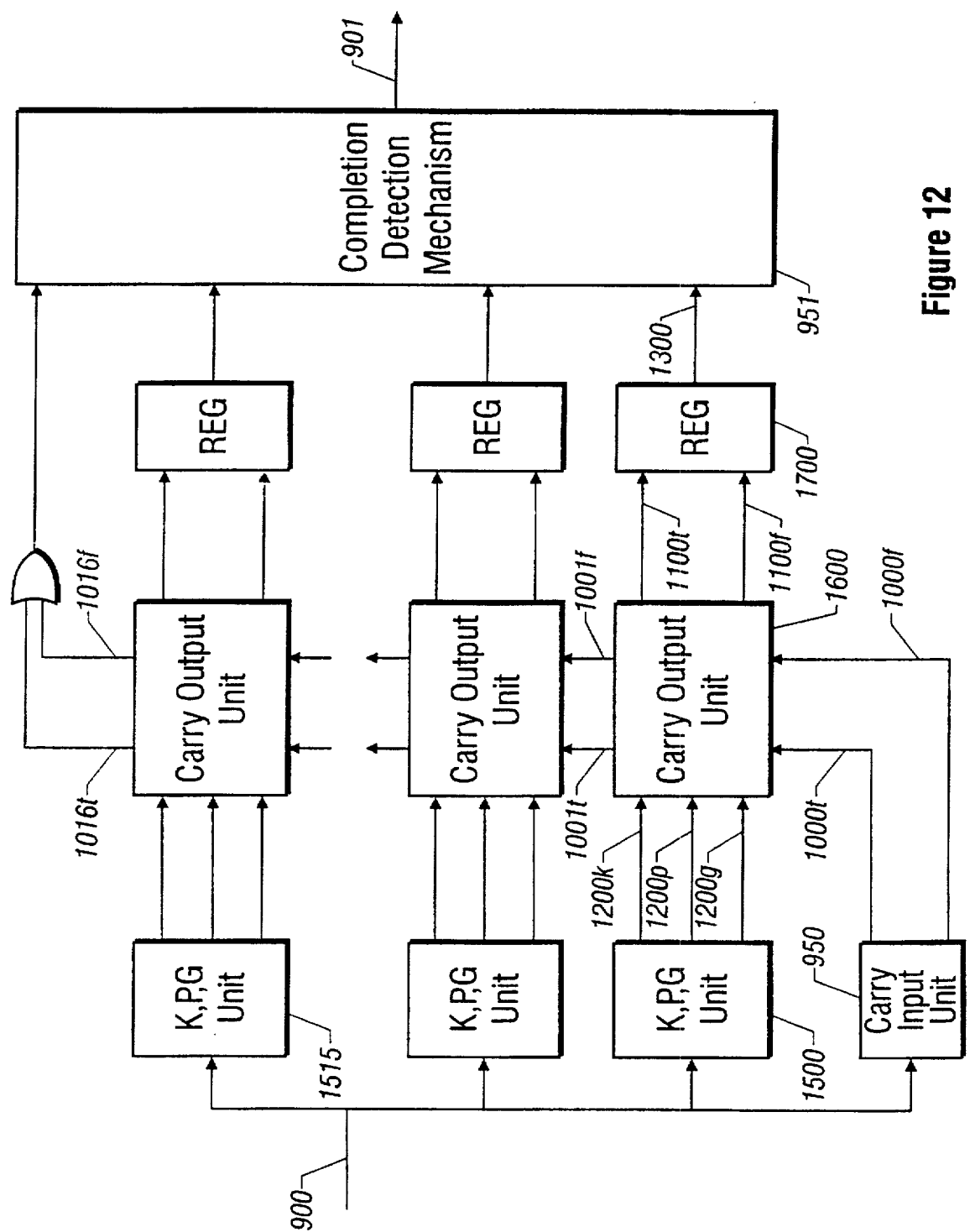
FIG. 12 shows a block diagram of an asynchronous ALU.

Referring to FIG. 12, the block diagram for the ALU, we note that a upward transition on signal 900 starts the computation. At this point, variables x, y, and op have stable and valid values. Unit 1500 generates KPG ("kill, propagate, generated") signals 1200k, 1200p, and 1200g for the least significant bit based on the value of op and the value of the least significant bit of x and y. Unit 1600 receives these KPG signals and a pair of carry-input signals (1000t and 1000f) and produces a pair of carry-output signals (1001t and 1001f) and a pair of result signals (1100t and (1100f). The transitions from invalid to valid values on the carry-output signals can be produced before the carry-input transitions to valid values have arrived in the case of a "kill" or "generate" valid value. Only in the case of a "propagate" must the carry-input signals arrive before the carry-output signals are produced. Both the KPG and the carry-input transitions are needed before the result transitions is produced. The result signals are fed into a register, unit 1700, similar to that shown in FIG. 6 (but without the enable signal). The register produces the completion signal 1300.

Units 1501 through 1515, 1601 through 1615, and 1701 through 1715 perform the same functions as units 1500, 1600 and 1700 but on the more significant bits on the ALU.

Unit 950 produces the carry-input to the least significant bit, which depends on the value op. Unit 951 is a completion detection mechanism with seventeen input signals. The extra input is necessary to insure that a transition on the carry-out signals of the most significant bit (1016t or 1016f has occurred.

The transition on the final output signal 901 signifies the completion of the ALU operation. All signals shown then execute through the valid/invalid cycle.

The time needed to perform an ALU operation is variable because of the use of KPG signals. (The fewer adjacent "propagate" signals, the faster the ALU operation.) This is an advantage in a processor with fully asynchronous execution, since the average performance on the ALU is significantly faster than the worst case performance.

Figure 13:
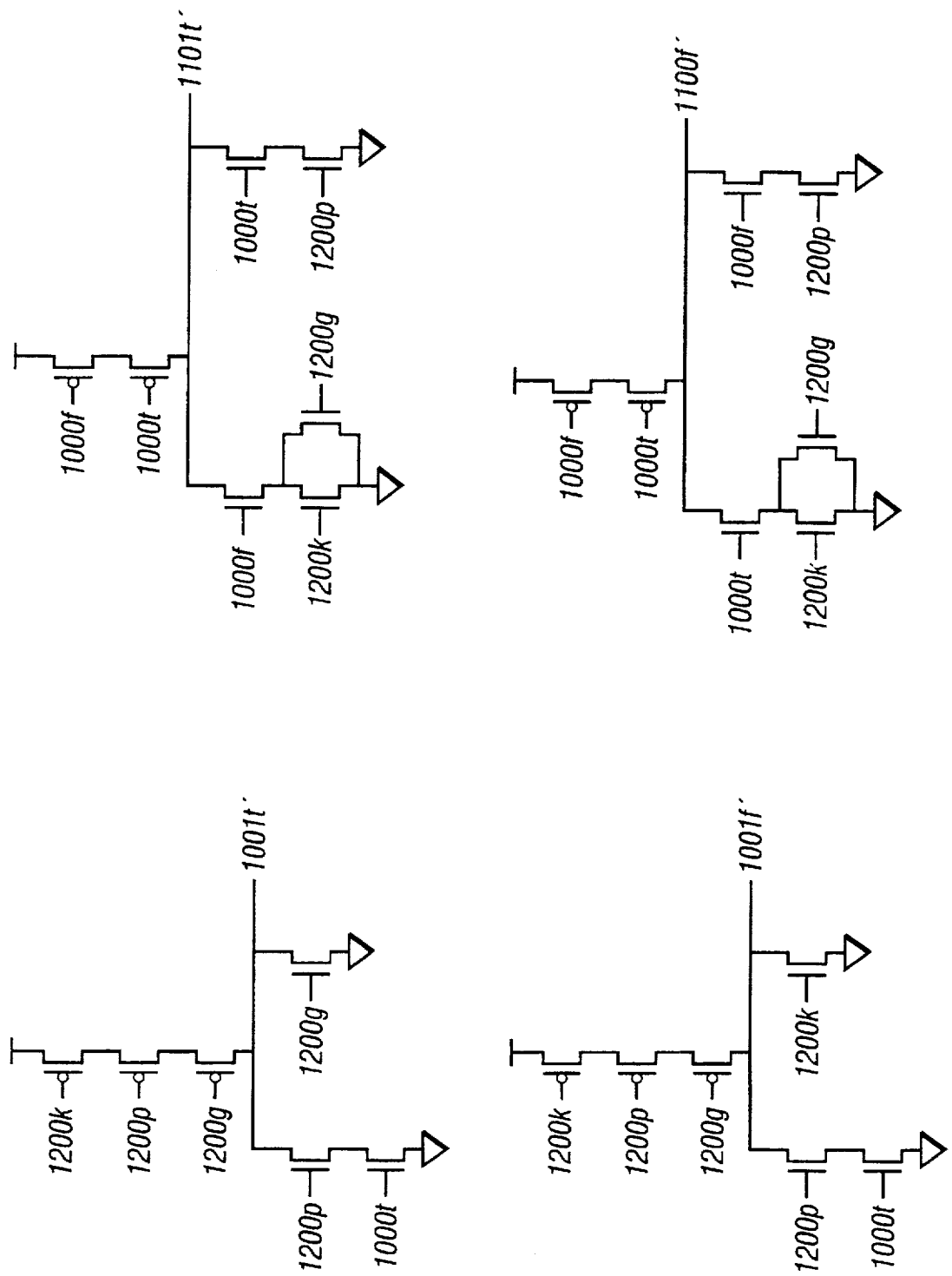
FIG. 13 shows a detailed CMOS implementation of the carry chain of an asynchronous ALU.

FIG. 13 shows a detailed CMOS implementation of the carry and result producing unit 1600. The job of detecting the invalid state of the carry-in signals and the KPG signals is split between the circuitry for producing the result signals and the carry-out signals. An invalid value on the result signals implies the carry-in signals are invalid, and an invalid value on the carry-out signals implies the KPG signals are invalid.

Since the carry-out of each bit is inverted relative to the carry-in, it is possible (though not shown in the figures) to alternate the logic encoding of the stages in the carry chain: A carry-in that has a true value when high generates a carry-out that has a true value when low, and vice-versa for the next stage. With this coding, only one CMOS gate delay is incurred per stage.

CONCLUSION AND SCOPE

Thus the reader will see that the data processor of the invention provides the speed advantage of asynchronous design by exploiting the variable duration of execution of the instructions thanks novel implementation techniques that minimizes the overhead of the control parts, of completion detection, and of the valid/invalid cycle of the data part. In addition, by providing an implementation the correct operation thereof is independent of delays in logic elements and wire, the invention makes it possible to realize data processors with a robustness to variations in supply voltage and temperature never achieved heretofore.

While the above description contains many specificities, the reader should not construe these as limitations on the scope of the invention, but merely as exemplifications of preferred embodiments thereof. Those skilled in the art will envision many other possible variations are within its scope. For example, skilled practitioners will readily be able to change the organization of the pipeline and add standard features such as delayed branching and interrupts. The register array may also be modified or even replaced with a last-in-first-out stack, instruction cache and data cache may be added on the interfaces to the memories, and the instruction set can be modified to exploit even further the variability of instruction execution. All said modifications don't depart from the spirit and scope of the invention.

Accordingly, the scope of the invention should be determined not by the embodiments illustrated but by the appended claims and their legal equivalents.

We claim:

1. A process performed by an asynchronous processor using a plurality of acknowledge/receive handshake communication actions which are control handshakes between pairs of elements of said processor, said communication actions being taken in lieu of a synchronous clock signal so that said asynchronous processor is independent of any synchronous clock signal, said processor comprising an instruction fetcher and a program counter maintaining a current program count pc, said instruction fetcher being in communication with said program counter and with an instruction memory containing a sequence of instructions to be executed by said processor, said process comprising:

(A) an instruction fetching operation comprising:

(1) upon completion of a first handshake communication action between said instruction fetching operation and said program counter to indicate that a current operation should be carried out, fetching a current instruction from said instruction memory at a memory location corresponding to a current value of said program count pc in response to said first handshake, and completing a second handshake communication action thereafter with said program counter without a clock signal;

(B) a program count process performed by said program counter comprising:

(1) upon completion of said first handshake communication action, computing an incremented program count from said program count without a clock signal, and (2) upon completion of said second handshake communication action, replacing said program count with said incremented program count without a clock signal.

2. An asynchronous processing apparatus, comprising:

a fetching module operating to fetch a instruction to be executed from an instruction memory, and to produce an instruction output indicating an instruction to be executed;

an execution module, operating based on the instruction output from said fetching module, to decode the instruction produced by the fetching module, to produce parameters indicative of how the instruction decoded by the fetching module should be used;

a plurality of other processing modules, each module carrying out a processing operation, and each module operating independently and without a common clock, all of said other processing modules commonly connected to at least first and second parameter buses and at least one result bus, said other processing modules including:

(A) at least two registers;

(B) an arithmetic unit, which operates based on values that are supplied from said first and second registers on said first and second parameter buses to form a result which is communicated to said result bus; and (C) a memory unit, which carries out memory fetch operations using values supplied from and to said first and second registers, wherein each of said plurality of modules including components operates asynchronously relative to one another, without a common clock therebetween, said modules each including a first element, operating by evaluating input information to detect whether valid information is present as a beginning of an information cycle, to operate on the valid information during its information cycle and to prepare a confirmation when the operation is complete, lack of valid data being detected as an end of an information cycle.

3. Apparatus as in claim 2 wherein each of said plurality of units each are divided into two separated and communicating parts: a control part and a data part, each control part including elements which sequence action to determine when valid data is present and to provide an indication that processing is complete, and each said data part carries out data manipulation of the valid data so received.

4. An asynchronous processing apparatus, comprising:

a fetching module operating to fetch a instruction to be executed from an instruction memory, and to produce an instruction output indicating an instruction to be executed;

an execution module, operating based on the instruction output from said fetching module, to decode the instruction produced by the fetching module, to produce parameters indicative of how the instruction decoded by the fetching module should be used;

a plurality of other processing modules, each module carrying out a processing operation, and each module operating independently and without a common clock, all of said other processing modules commonly connected to at least first and second parameter buses and at least one result bus, said other processing modules including:

(A) at least two registers;

(B) an arithmetic unit, which operates based on values that are supplied from said first and second registers on said first and second parameter buses to form a result which is communicated to said result bus; and (C) a memory unit, which carries out memory fetch operations using values supplied from and to said first and second registers, wherein each of said plurality of modules including components operates asynchronously relative to one another, without a common clock therebetween, said modules each including a first element, operating by evaluating input information to detect whether valid information is present as a beginning of an information cycle, to operate on the valid information during its information cycle and to prepare a confirmation when the operation is complete, lack of valid data being detected as an end of an information cycle;

each of said plurality of units being divided into two separated and communicating parts: a control part and a data part, each control part including elements which sequence action to determine when valid data is present and to provide an indication that processing is complete, and each said data part carrying ies out data manipulation of the valid data so received, wherein said data part includes a completion detection circuit, an output of said completion detection circuit driving an element in said control circuit which sends a confirmation that a current process is completed.

5. An asynchronous processing apparatus, comprising:

a fetching module, operating to fetch an instruction to be executed from an instruction memory to produce an instruction output indicating an instruction to be executed;

an execution module, operating based on an instruction output of said fetching module, to decode the object of the fetching module to produce parameters indicative of how the instruction from said fetching module should be used;

a plurality of other processing modules, each module carrying out an operation for processing, and each module operating independently and without any common clock, each module receiving in parallel at least first and second parameter buses, and at least one other result bus, said modules including:

(A) at least first and second registers;

(B) an arithmetic logic unit, which operates on values that are supplied from said first and second registers, and C) a memory unit, which carries out memory fetch operations using values supplied to and from said first and second registers, each of said plurality of modules including an information part, controlling operation asynchronously relative to other modules without a common clock therebetween, each module operating to detect whether valid data is present as a beginning of an information cycle to appropriately operate on the valid data during its information cycle, and (D) a confirmation element, operating to send a confirmation that a current operation is complete, and to detect lack of valid data as an end of information cycle, wherein said execution module includes an element which investigates a particular instruction output to determine a module which is needed to execute said particular instruction, determines registers to be used by said module, said execution module defining functions of those registers according to a function which is needed by said module, said module using said registers according to said functions.

6. An apparatus as in claim 5 wherein said buses include an X bus, a Y bus, a Za bus and Zm bus, all of which are attached to all of said modules.

7. An apparatus as in claim 6 wherein said modules further include a program counter address unit, connected to all of said buses.

8. An apparatus as in claim 7 wherein said particular instruction indicated by said instruction output requires use of arithmetic logic unit, the X bus and Y bus being used to send the parameters from the first and second registers to the arithmetic logic unit.

9. An apparatus as in claim 8 wherein the parameters are stored in first and second registers, said instruction being supplied to all of said first and second registers and said arithmetic logic unit, to simultaneously command the first and second registers to move the values from the first and second registers on to the X and Y buses respectively, and to command the arithmetic logic unit to add those values on the X and Y buses, and return those values to the Za bus which stores said values in a third register.

10. An apparatus as in claim 7, further comprising an addressing unit as one of said other processing modules, and wherein said command is a program counter command, and said X bus and Y bus respectively transmit program counter information and offset information to and from the addressing unit.

11. An apparatus as in claim 6 wherein said Za bus transmits the results of a arithmetic logic unit operation to its result registers, and the Zm bus transmits a result of a memory unit operation from the data memory to a result register.

12. A system as in claim 6 wherein said arithmetic logic unit and said memory unit always use a particular bus and predetermined registers without checking for their availability.

13. A system as in claim 5 wherein the execution module includes commands which select the function to be carried out by the X and Y buses.

14. A system as in claim 13 wherein said execution module detects that a current function is an execute function, and commands a register to communicate with the arithmetic logic unit using the X, Y and Za buses which it exclusively uses.

15. A system as in claim 13 wherein said execute element detects a memory unit command, and reserves X and Y and Zm buses for said memory commands.

16. An asynchronous processing apparatus, comprising:
a fetching module, operating to fetch a instruction to be executed from an instruction memory;
an execution module, operating based on an output of said fetching module, to decode the object of the fetching module, to produce parameters indicative of how the instruction decoded by the fetching module should be used;
a plurality of modules, each module carrying out an operation for processing, and each module operating independently and without any common clock, each module receiving in parallel at least first and second parameter buses, and at least one other result bus, said modules including:
(A) at least two registers;
(B) an arithmetic logic unit, which operates on values that are supplied to and from said first and second registers, and a memory unit, which carries out memory fetch operations using values supplied from and to said first and second registers, each of said plurality of units operating asynchronously relative to one another, without a common clock therebetween, and each unit including an information part operating to detect whether valid data is present, to appropriately operate on the valid data during its information cycle, to send a confirmation that the operation is complete; and wherein the command decoded by the execution unit includes an index which selects one of said buses for exclusive use with a register whose address is indicated by said index.

17. An asynchronous processor, comprising:
first and second processes which communicate with one another, said first process comprising a control part which sequences actions within the process and a data part which manipulates data within the process, said data part including at least an element for carrying out an operation on values in registers;
said control part in said first process including a handshake line which goes to a predetermined state to command action from said second process, said control part and said second process receiving said predetermined state, and producing a first signal indicative thereof, said data part in said second process receiving said first signal as an enable signal, said data part in said second unit including an element which produces an output that can be recognized as an invalid state when said enable is not active, and, when said enable is brought active, changes said invalid state into a valid state, said valid state being sent to said data part of said first process,
said data part of said first process receiving said valid state, decoding said valid state to remove the data therefrom, and passing the data therefrom to another element, an indication of said data being valid also being sent to said control part of said first unit which removes said handshaking signal, which causes said control part of said second unit to change state which removes the enable from said data part of said second unit thereby unenabling said second unit and causing an invalid output therefrom to indicate that no data is present thereon.

18. A system as in claim 17 wherein said receiving unit includes a completion detection mechanism.

19. An asynchronous processing apparatus, comprising:
a fetching module operating to fetch a instruction to be executed from an instruction memory, and to produce an instruction output indicating an instruction to be executed;
an execution module, operating based on the instruction output from said fetching module, to decode the instruction produced by the fetching module, to produce parameters indicative of how the instruction decoded by the fetching module should be used;
a plurality of other processing modules, each module carrying out a processing operation, and each module operating independently and without a common clock, all of said other processing modules commonly connected to at least first and second parameter buses and at least one result bus, said other processing modules including:

(A) at least two registers;

(B) an arithmetic unit, which operates based on values that are supplied from said first and second registers on said first and second parameter buses to form a result which is communicated to said result bus; and (C) a memory unit, which carries out memory fetch operations using values supplied from and to said first and second registers, wherein each of said plurality of modules including components operates asynchronously relative to one another, without a common clock therebetween X and Y buses, commonly connected to all of said modules, said execution module interpreting said command and assigning two processes to each bus, one process being a register and the other being a module.

20. An apparatus as in claim 19 further comprising a Z bus, the Z bus transmitting the result of an operation to the registers.

21. An apparatus as in claim 20 wherein said execution module assigns the buses to a particular function, and wherein each of said modules use specific buses for a particular function according to the assignment.

22. An apparatus as in claim 21 wherein the arithmetic logic unit module uses X and Y buses to receive parameters of its operation and uses the Z bus to send results back to a register.

23. An apparatus as in claim 21 wherein the memory unit receives parameters of address calculation on the X and Y bus.

24. An apparatus as in claim 21 wherein the arithmetic logic unit module uses X and Y buses to receive parameters of its operation and uses the Z bus to send results back to a register.

25. An apparatus as in claim 21 wherein the memory unit receives parameters of address calculation on the X and Y bus.

26. An asynchronous processing apparatus, comprising:

a fetching module operating to fetch a instruction to be executed from an instruction memory, and to produce an instruction output indicating an instruction to be executed;

an execution module, operating based on the instruction output from said fetching module, to decode the instruction produced by the fetching module, to produce parameters indicative of how the instruction decoded by the fetching module should be used;

a plurality of other processing modules, each module carrying out a processing operation, and each module operating independently and without a common clock, all of said other processing modules commonly connected to at least first and second parameter buses and at least one result bus, said other processing modules including:

(A) at least two registers;

(B) an arithmetic unit, which operates based on values that are supplied from said first and second registers on said first and second parameter buses to form a result which is communicated to said result bus; and (C) a memory unit, which carries out memory fetch operations using values supplied from and to said first and second registers, wherein each of said plurality of modules including components operates asynchronously relative to one another, without a common clock therebetween said execution module interpreting said command and determining registers and buses which will be used to execute said command, said execution module including an allocation function of allocating registers and buses for predetermined functions, and reserving said registers and buses, said command sent to a module to carry out said command, said module always using X and Y buses to obtain said information.

27. An asynchronous processing apparatus, comprising:

a fetching module operating to fetch a instruction to be executed from an instruction memory, and to produce an instruction output indicating an instruction to be executed;

an execution module, operating based on the instruction output from said fetching module, to decode the instruction produced by the fetching module, to produce parameters indicative of how the instruction decoded by the fetching module should be used;

a plurality of other processing modules, each module carrying out a processing operation, and each module operating independently and without a common clock, all of said other processing modules commonly connected to at least first and second parameter buses and at least one result bus, said other processing modules including:

(A) at least two registers;

(B) an arithmetic unit, which operates based on values that are supplied from said first and second registers on said first and second parameter buses to form a result which is communicated to said result bus; and (C) a memory unit, which carries out memory fetch operations using values supplied from and to said first and second registers, wherein each of said plurality of modules including components operates asynchronously relative to one another, without a common clock therebetween said execution module interpreting said command and determining registers and buses which will be used to execute said command, said execution module including an allocation function of allocating registers and buses for predetermined functions, and reserving said registers and buses, said command sent to a module to carry out said command, said module always using X and Y buses to obtain said information, wherein said data part includes a completion detection circuit, an output of said completion detection circuit driving an element in said control circuit which sends a confirmation that a current process is completed.

28. An asynchronous processing apparatus, comprising:

a fetching module operating to fetch a instruction to be executed from an instruction memory, and to produce an instruction output indicating an instruction to be executed;

an execution module, operating based on the instruction output from said fetching module, to decode the instruction produced by the fetching module, to produce parameters indicative of how the instruction decoded by the fetching module should be used;

a plurality of other processing modules, each module carrying out a processing operation, and each module operating independently and without a common clock, all of said other processing modules commonly connected to at least first and second parameter buses and at least one result bus, said other processing modules including:

(A) at least two registers;

(B) an arithmetic unit, which operates based on values that are supplied from said first and second registers on said first and second parameter buses to form a result which is communicated to said result bus; and (C) a memory unit, which carries out memory fetch operations using values supplied from and to said first and second registers, wherein each of said plurality of modules including components operates asynchronously relative to one another, without a common clock therebetween, said execution module decoding and creating a selection action for a predetermined bus, a communication on said predetermined bus occurring at the same time as said selection action, each selection action being a guarded command which excludes in time other guarded commands, to ensure that said bus carries out only one of said selection actions at any one time.

29. An apparatus as in claim 28 wherein there are X and Y commands.

30. An asynchronous processing apparatus, comprising:

a fetching module operating to fetch a instruction to be executed from an instruction memory, and to produce an instruction output indicating an instruction to be executed;

an execution module, operating based on the instruction output from said fetching module, to decode the instruction produced by the fetching module, to produce parameters indicative of how the instruction decoded by the fetching module should be used, wherein said execution module includes a command line for a particular bus, said particular bus being reserved for a register whose index has a predetermined relationship with a field and a command;

a plurality of other processing modules, each module carrying out a processing operation, and each module operating independently and without a common clock, all of said other processing modules commonly connected to at least first and second parameter buses and at least one result bus, said other processing modules including:

(A) at least two registers;

(B) an arithmetic unit, which operates based on values that are supplied from said first and second registers on said first and second parameter buses to form a result which is communicated to said result bus; and (C) a memory unit, which carries out memory fetch operations using values supplied from and to said first and second registers, wherein each of said plurality of modules including components operates asynchronously relative to one another, without a common clock therebetween, said execution module decoding and creating a selection action for a predetermined bus, a communication on said predetermined bus occurring at the same time as said selection action, each selection action being a guarded command which excludes in time other guarded commands, to ensure that said bus carries out only one of said selection actions at any one time.

31. A method of sharing registers in an asynchronous processing system, comprising:

obtaining an instruction from a program memory;

decoding said instruction into a form which can be used by an execution module;

determining a second, consecutive instruction;

determining if uses of a first register during said first instruction could interfere with use of the register during the second instruction;

setting a variable to a true state when the register is selected for writing;

setting the variable back to a false state after the register has been used for writing; and blocking subsequent selection of the register until the writing is complete.

32. Method as in claim 31 wherein said instruction is an arithmetic logic unit instruction or a memory unit instruction, using first and second buses to access registers for operands to the instruction unit, and using a third register to provide the result of the instruction to a register.

33. Method as in claim 32 wherein said third register is guarded.

34. Method as in claim 31 further comprising setting a first communication to indicate that a register writing operation is desired, and determining that said first communication is over.

35. A method of operating a processor without a clock, comprising:

providing a pair of wires between a first part of the processor and a second part of the processor;

initially, leaving said wires in a state relative to one another which represents invalid data;

changing the state of said wires to represent valid data, said state representing a request for action from the second part of the processor;

the second part of the processor changing the state of another one of the wires to indicate from an invalid state to a first state to indicate that the command has been received, said first part of the processor then changing the state of the first set of wires to a different, valid state;

said second processor completing the operation and changing said second wire to a second state, different from the first state of the second wire;

said first part of the processor receiving said second state, recognizing that said second state signals a completion, and, in response to said completion, bringing said first wires back to the invalid state; and said second processor recognizing the invalid state, and responding by bringing said second set of wires to the invalid state.

36. A method of operating a processor without a clock, comprising:

providing a pair of wires between a first part of the processor and a second part of the processor;

initially, leaving said wires in a state relative to one another which represents invalid data;

changing the state of said wires to represent valid data, said state representing a request for action from the second part of the processor;

the second part of the processor changing the state of another one of the wires to indicate from an invalid state to a first state to indicate that the command has been received, said first part of the processor then changing the state of the first set of wires to a different, valid state;

said second processor completing the operation and changing said second wire to a second state, different from the first state of the second wire;

said first part of the processor receiving said second state, recognizing that said second state signals a completion, and, in response to said completion, bringing said first wires back to the invalid state; and said second processor recognizing the invalid state, and responding by bringing said second set of wires to the invalid state, wherein said wires use a four-phase return to zero protocol.

37. An asynchronous processing apparatus, comprising:

a fetching module operating to fetch a instruction to be executed from an instruction memory, and to produce an instruction output indicating an instruction to be executed;

an execution module, operating based on the instruction output from said fetching module, to decode the instruction produced by the fetching module, to produce parameters indicative of how the instruction decoded by the fetching module should be used;

a plurality of other processing modules, each module carrying out a processing operation, and each module operating independently and without a common clock, all of said other processing modules commonly connected to at least first and second parameter buses and at least one result bus, said other processing modules including:

(A) at least two registers;

(B) an arithmetic unit, which operates based on values that are supplied from said first and second registers on said first and second parameter buses to form a result which is communicated to said result bus; and (C) a memory unit, which carries out memory fetch operations using values supplied from and to said first and second registers, wherein each of said plurality of modules including components operates asynchronously relative to one another, without a common clock therebetween wherein said modules are connected to one another by a communication channel which allows communicating at least true, false and invalid, said executing module communicating with said other modules by first requesting an operation via a first valid value, receiving an indication that the first valid value has been received via second valid value, receiving an indication that the operation has been completed via a second valid value, and acknowledging that the operation has been completed by using an invalid value.

38. A method of operating an asynchronous processor, comprising:

fetching an instruction to be executed from an instruction memory;

operating on the fetched instruction and decoding the instruction to produce parameters indicative of how the decoded instruction should be used;

said parameters including at least an indication of a module among at least an arithmetic logic unit module and a memory module which will execute the instruction, and an indication of parameters to be used by an executing module;

reserving first and second buses to transmit the parameters from the registers to the executing module; and reserving a third bus to transmit the parameters from the executing module to another register, wherein buses are used without arbitration since the buses have been reserved.

39. A method of operating an asynchronous processor, comprising:

fetching an instruction to be executed from an instruction memory;

operating on the fetched instruction and decoding the instruction to produce parameters indicative of how the decoded instruction should be used;

said parameters including at least an indication of a module among at least an arithmetic logic unit module and a memory module which will execute the instruction, and an indication of parameters to be used by the executing module;

reserving first and second buses to transmit the parameters from the registers to the executing module; and reserving a third bus to transmit the parameters from the executing unit to another register, wherein buses are used without arbitration since the buses have been reserved, wherein the executing module communicates to the receiving module by issuing a request by changing an invalid state signal into a valid state signal to request an operation, and recognizing an invalid state as an end of an operation cycle.

40. An asynchronous processing apparatus, comprising:

a fetching module operating to fetch a instruction to be executed from an instruction memory, and to produce an instruction output indicating an instruction to be executed;

an execution module, operating based on the instruction output from said fetching module, to decode the instruction produced by the fetching module, to produce parameters indicative of how the instruction decoded by the fetching module should be used;

a plurality of other processing modules, each module carrying out a processing operation, and each module operating independently and without a common clock, all of said other processing modules commonly connected to at least first and second parameter buses and at least one result bus, said other processing modules including:

(A) at least two registers;

(B) an arithmetic unit, which operates based on values that are supplied from said first and second registers on said first and second parameter buses to form a result which is communicated to said result bus; and (C) a memory unit, which carries out memory fetch operations using values supplied from and to said first and second registers, first, second and third buses, and a bus allocation device, reserving the first and second buses to transmit the parameters from the registers to the executing module and reserving a third bus to transmit the parameters from the executing unit to another register, wherein buses are used without arbitration since the buses have been reserved.

41. A method of operating an asynchronous processor, comprising:

fetching an instruction to be executed from an instruction memory;

operating on the fetched instruction and decoding the instruction to produce parameters indicative of how the decoded instruction should be used;

said parameters including at least an indication of a module among at least an arithmetic logic unit module and a memory module which will execute the instruction, and an indication of parameters to be used by the executing module;

reserving first and second buses to transmit the parameters from the registers to the executing module; and reserving a third bus to transmit the parameters from the executing unit to another register, wherein buses are used without arbitration since the buses have been reserved, wherein the executing module communicates to the receiving module by issuing a request by changing an invalid state signal into a valid state signal to request an operation, and recognizing an invalid state as an end of an operation cycle.

42. An asynchronous processing apparatus, comprising:

a fetching module operating to fetch a instruction to be executed from an instruction memory, and to produce an instruction output indicating an instruction to be executed;

an execution module, operating based on the instruction output from said fetching module, to decode the instruction produced by the fetching module, to produce parameters indicative of how the instruction decoded by the fetching module should be used;

a plurality of other processing modules, each module carrying out a processing operation, and each module operating independently and without a common clock, all of said other processing modules commonly connected to at least first and second parameter buses and at least one result bus, said other processing modules including:

(A) at least two registers;

(B) an arithmetic unit, which operates based on values that are supplied from said first and second registers on said first and second parameter buses to form a result which is communicated to said result bus; and (C) a memory unit, which carries out memory fetch operations using values supplied from and to said first and second registers, wherein each of said plurality of modules including components operates asynchronously relative to one another, without a common clock therebetween, wherein each module includes a valid/invalid logic therein, said module operating by detecting a request for information as a transition from an invalid signal to a valid signal, said units receive information from said valid signals, and an end of the information period being signalled by a return to an invalid signal.

* * * * *